United States Patent
Kim et al.

(10) Patent No.: US 12,342,521 B2
(45) Date of Patent: Jun. 24, 2025

(54) STATIC RANDOM-ACCESS MEMORY (SRAM) DEVICE INCLUDING THREE-DIMENSIONAL STACKED (3DS) FIELD-EFFECT TRANSISTOR (FET) AND LAYOUT THEREOF

(71) Applicant: Samsung Electronics Co., Ltd., Suwon-si (KR)

(72) Inventors: Kyungsoo Kim, Hwaseong-si (KR); Kyenhee Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 486 days.

(21) Appl. No.: 17/730,962

(22) Filed: Apr. 27, 2022

(65) Prior Publication Data

US 2023/0105461 A1 Apr. 6, 2023

(30) Foreign Application Priority Data

Sep. 17, 2021 (KR) .................. 10-2021-0125250

(51) Int. Cl.
*H10B 10/00* (2023.01)
*G11C 11/412* (2006.01)

(52) U.S. Cl.
CPC .......... *H10B 10/125* (2023.02); *G11C 11/412* (2013.01); *H10B 10/00* (2023.02); *H10B 10/12* (2023.02)

(58) Field of Classification Search
CPC ...... H10B 10/125; H10B 10/00; H10B 10/12; G11C 11/412
See application file for complete search history.

(56) References Cited

U.S. PATENT DOCUMENTS

| | | | |
|---|---|---|---|
| 9,000,530 | B2 | 4/2015 | Balakrishnan et al. |
| 9,419,003 | B1 | 8/2016 | Colinge et al. |

(Continued)

FOREIGN PATENT DOCUMENTS

| | | |
|---|---|---|
| TW | 201703234 A | 1/2017 |
| TW | 201730794 A | 9/2017 |

(Continued)

OTHER PUBLICATIONS

Office Action dated Jun. 4, 2024 for corresponding TW Patent Application No. 111123445.

*Primary Examiner* — Steven B Gauthier
*Assistant Examiner* — Alvin L Lee
(74) *Attorney, Agent, or Firm* — Muir Patent Law, PLLC

(57) ABSTRACT

A static random-access memory (SRAM) device including a three-dimensional structured (3DS) field-effect transistor (FET) having a minimized planar area and a simple wiring connection structure includes a semiconductor substrate, a first fin active region extending on the semiconductor substrate in a first direction, a second fin active region extending on the semiconductor substrate in the first direction and apart from the first fin active region in a second direction perpendicular to the first direction, and four gates extending in the second direction and intersecting part of the first fin active region or the second fin active region. Each of the first fin active region and the second fin active region includes a first region in which only a lower layer is arranged and a second region in which an upper layer is arranged on the lower layer.

20 Claims, 27 Drawing Sheets

(56) References Cited

U.S. PATENT DOCUMENTS

| | | | |
|---|---|---|---|
| 10,229,917 | B2 | 3/2019 | Balakrishnan et al. |
| 10,332,588 | B2 | 6/2019 | Bao et al. |
| 10,707,218 | B2 | 7/2020 | Paul et al. |
| 10,741,564 | B2 | 8/2020 | Lee et al. |
| 10,756,096 | B2 | 8/2020 | Paul et al. |
| 2019/0088553 | A1* | 3/2019 | Van Dal .......... H01L 21/823871 |
| 2020/0027869 | A1 | 1/2020 | Yeh et al. |
| 2020/0111798 | A1* | 4/2020 | Paul ................... H10D 30/6757 |
| 2020/0118616 | A1 | 4/2020 | Morris et al. |
| 2021/0057023 | A1 | 2/2021 | Liaw |
| 2021/0265335 | A1 | 8/2021 | Liaw |
| 2022/0102362 | A1* | 3/2022 | Chanemougame .......................... H01L 27/0688 |

FOREIGN PATENT DOCUMENTS

| | | |
|---|---|---|
| TW | 201802801 A | 1/2018 |
| TW | 201906139 A | 2/2019 |
| TW | 202006928 A | 2/2020 |
| TW | 202109766 A | 3/2021 |

\* cited by examiner

STATIC RANDOM-ACCESS MEMORY (SRAM) DEVICE INCLUDING THREE-DIMENSIONAL STACKED (3DS) FIELD-EFFECT TRANSISTOR (FET) AND LAYOUT THEREOF

CROSS-REFERENCE TO RELATED APPLICATION

This application is based on and claims priority under 35 U. S. C. § 119 to Korean Patent Application No. 10-2021-0125250, filed on Sep. 17, 2021, in the Korean Intellectual Property Office, the disclosure of which is incorporated by reference herein in its entirety.

BACKGROUND

The inventive concept relates to a static random-access memory (SRAM) device, and more particularly, to an SRAM device including a three-dimensional stacked (3DS) field-effect transistor (FET).

Recently, down-scaling of semiconductor devices is rapidly progressing. In addition, because semiconductor devices require a correct operation as well as a high operation speed, the structures of transistors included in semiconductor devices are being optimized. In particular, as semiconductor devices are becoming highly integrated, semiconductor devices include multi-gate structured 3D transistors. For example, a 3D transistor may be implemented so that a gate surrounds an active pin formed on a substrate.

SUMMARY

The inventive concept relates to a static random access memory (SRAM) device including a three-dimensional stacked (3DS) field effect transistor (FET) having a minimized planar area and a simple wiring connection structure and a layout thereof.

A problem to be solved by the inventive concept is not limited to the above-described one and other objects will be clearly understood those skilled in the art from the following description.

According to an embodiment of the present invention, a static random-access memory (SRAM) device including a three-dimensional structured (3DS) field-effect transistor (FET) includes a semiconductor substrate, a first fin active region extending on the semiconductor substrate in a first direction and including a first region and a second region, wherein in the first region and the second region, a first lower layer is arranged, wherein only in the second region, a first upper layer is arranged on the first lower layer, and wherein the second region is to the right of the first region, a second fin active region extending on the semiconductor substrate in the first direction and including a third region and a fourth region, wherein in the third region and the fourth region, a second lower layer is arranged, wherein only in the fourth region, a second upper layer is arranged on the second lower layer, wherein the fourth region is to the left of the third region, and wherein the second fin active region is spaced apart from the first fin active region in a second direction perpendicular to the first direction, a first gate electrode extending along a first straight line extending in the second direction and intersecting the first region, a second gate electrode extending along a second straight line extending in the second direction and intersecting the second region, wherein the first gate electrode and the second gate electrode are spaced apart from each other in the first direction, a third gate electrode extending along the first straight line extending in the second direction and being separate from the second gate electrode in the second direction, and intersecting the third region, a fourth gate electrode extending along the second straight line extending in the second direction and being separate from the first gate electrode in the second direction, and intersecting the fourth region, wherein the third gate electrode and the fourth gate electrode are spaced apart from each other in the first direction, a first node connecting the fourth gate electrode to the second region, and a second node connecting the second gate electrode to the fourth region, wherein the first gate electrode and the first lower layer of the first region constitute a first pass transistor, wherein the second gate electrode and the first lower layer of the second region constitute a first pull-down transistor, wherein the second gate electrode and the first upper layer of the second region constitute a first pull-up transistor, wherein the third gate electrode and the second lower layer of the third region constitute a second pass transistor, wherein the fourth gate electrode and the second lower layer of the fourth region constitute a second pull-down transistor, and wherein the fourth gate electrode and the second upper layer of the fourth region constitute a second pull-up transistor.

According to an embodiment of the present invention, a static random-access memory (SRAM) device includes a semiconductor substrate, a first fin active region extending on the semiconductor substrate in a first direction, a second fin active region extending on the semiconductor substrate in the first direction and being spaced apart from the first fin active region in a second direction perpendicular to the first direction, and four gate electrodes extending in the second direction. Two gate electrodes among the four gate electrodes intersecting the first fin active region and other two gate electrodes intersecting the second fin active region. Each of the first fin active region and the second fin active region comprises a first region in which only a lower layer is arranged, and a second region in which an upper layer is arranged on the lower layer. The two gate electrodes include a first gate electrode intersecting a second region of the first fin active region and is connected to a second region of the second fin active region through a first node. The other two gate electrodes include a second gate electrode intersecting a second region of the second fin active region and is connected to a second region of the first fin active region through a second node.

According to an embodiment of the present invention, a static random-access memory (SRAM) includes a plurality of horizontal fin active regions extending in a first direction and being spaced apart from one another in a second direction perpendicular to the first direction, a plurality of vertical fin active regions extending in the second direction, being spaced apart from one another in the first direction, and intersecting two neighboring horizontal fin active regions among the plurality of horizontal fin active regions, four gate electrodes extending in the second direction, being spaced apart from one another in a first region between the two neighboring vertical fin active regions, and intersecting the two neighboring horizontal fin active regions in the first region, wherein the four gate electrodes include a pair of inner gate electrodes and a pair of outer gate electrodes, wherein the pair of inner gate electrodes are disposed between the pair of outer gate electrodes, and wherein the pair of inner gate electrodes are shorter than the pair of outer gate electrodes, a pair of nodes disposed in the first region and connecting the pair of outer gate electrodes to a horizontal fin active region, adjacent to the two neighboring horizontal fin active regions, of the plurality of horizontal fin active regions, a plurality of first metal layers extending in the first direction and being spaced apart from one another in the second direction, wherein each of the plurality of horizontal fin active regions overlaps a corresponding first metal layer among the plurality of first metal layers, and a plurality of second metal layers extending in the second direction and being spaced apart from one another in the second direction. Each of the plurality of second metal layers is arranged between corresponding two neighboring gate electrodes among the four gate electrodes.

BRIEF DESCRIPTION OF THE DRAWINGS

Embodiments of the inventive concept will be more clearly understood from the following detailed description taken in conjunction with the accompanying drawings in which:

FIGS. 3A to 3D are cross-sectional views illustrating the SRAM device of FIG. 2, in which FIG. 3A is a cross-sectional view taken along line I-I' in FIG. 2, FIG. 3B is a cross-sectional view taken along line II-II' in FIG. 2, FIG. 3C is a cross-sectional view taken along line III-III' in FIG. 2, and FIG. 3D is a cross-sectional view taken along line IV-IV' in FIG. 2;

DETAILED DESCRIPTION OF THE EMBODIMENTS

Figure 1:
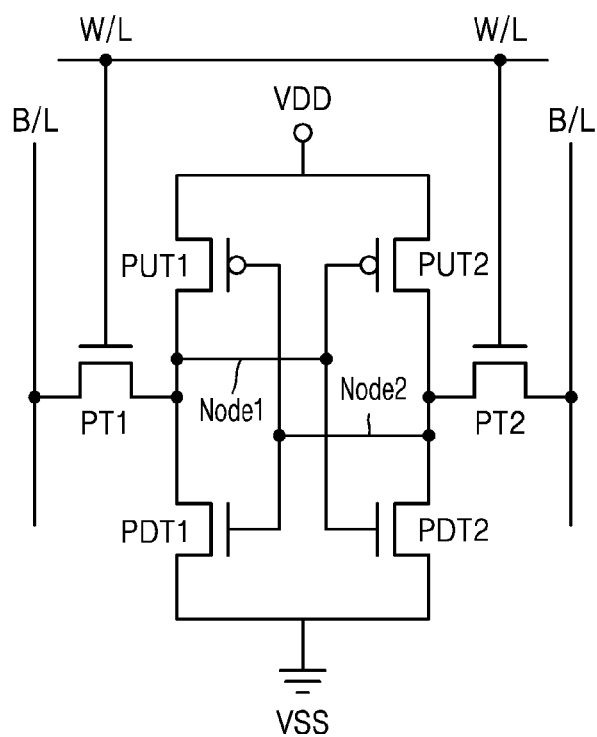
FIG. 1 is a circuit diagram illustrating a static random-access memory (SRAM) device including a three-dimensional stacked (3DS) field-effect transistor (FET) according to an embodiment of the inventive concept.

Hereinafter, embodiments of the inventive concept will be described in detail with reference to the accompanying drawings. Like reference numerals refer to like elements throughout and description thereof will not be given.

FIG. 1 is a circuit diagram illustrating a static random access memory (SRAM) device including a three-dimensional stacked (3DS) field effect transistor (FET) 100 according to an embodiment of the inventive concept.

Referring to FIG. 1, the SRAM device including the 3DS FET 100 (hereinafter, referred to as the 'SRAM device') may include or may be formed of six transistors. For example, the SRAM device 100 may include a first pass transistor PT1, a second pass transistor PT2, a first pull-up transistor PUT1, a second pull-up transistor PUT2, a first pull-down transistor PDT1, and a second pull-down transistor PDT2. In some embodiments, gates and bit lines B/L of the second pull-up transistor PUT2 and the second pull-down transistor PDT2 may be connected to source/drain regions of the first pass transistor PT1. In addition, gates and bit line bars $\overline{B/L}$ of the first pull-up transistor PUT1 and the first pull-down transistor PDT1 may be connected to source/drain regions of the second pass transistor PT2. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

In some embodiments, the first pass transistor PT1, the second pass transistor PT2, the first pull-down transistor PDT1, and the second pull-down transistor PDT2 may include n-channel metal-oxide-semiconductor (NMOS) FETs and the first pull-up transistor PUT1 and the second pull-up transistor PUT2 may include p-channel metal-oxide-semiconductor (PMOS) FETs. In addition, the first pull-up transistor PUT1 and the first pull-down transistor PDT1 may configure a complementary FET cFET and the second pull-up transistor PUT2 and the second pull-down transistor PDT2 may configure a complementary FET cFET. In addition, the first pull-up transistor PUT1 and the first pull-down transistor PDT1 and the second pull-up transistor PUT2 and the second pull-down transistor PDT2 may configure a storage element of the SRAM device 100.

In the SRAM device 100 according to some embodiments, the first pull-up transistor PUT1 and the first pull-down transistor PDT1 and the second pull-up transistor PUT2 and the second pull-down transistor PDT2 may include 3DS FETs. In addition, the 3DS FET may include a stacked nano-sheet structure. Hereinafter, referring to FIGS. 2 to 3D, a layout and a 3D structure of the SRAM device 100 according to some embodiments will be described in detail.

Figure 2:
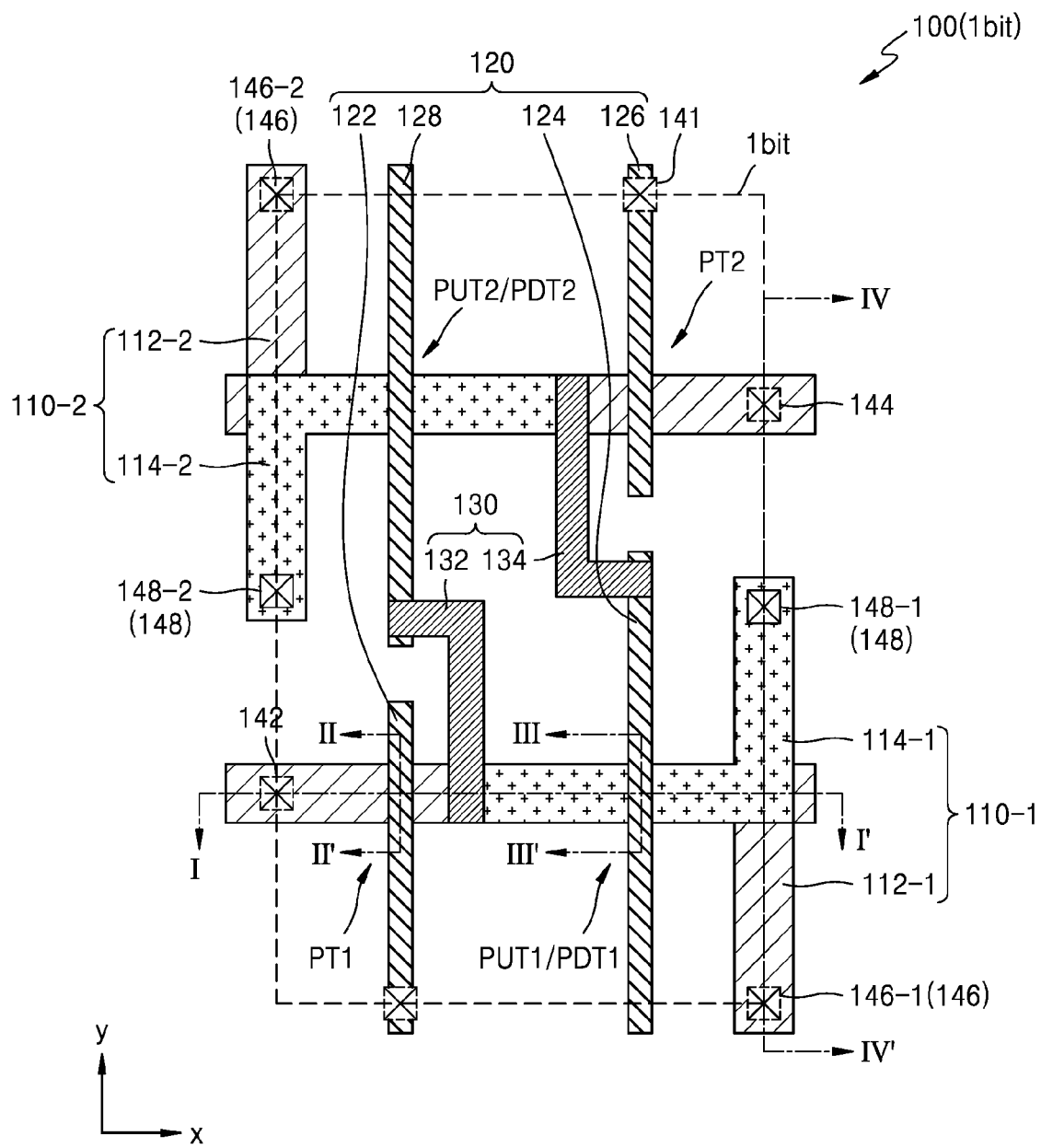
FIG. 2 is a layout diagram illustrating an SRAM device including a 3DS FET according to an embodiment of the inventive concept.
Figure 3A:
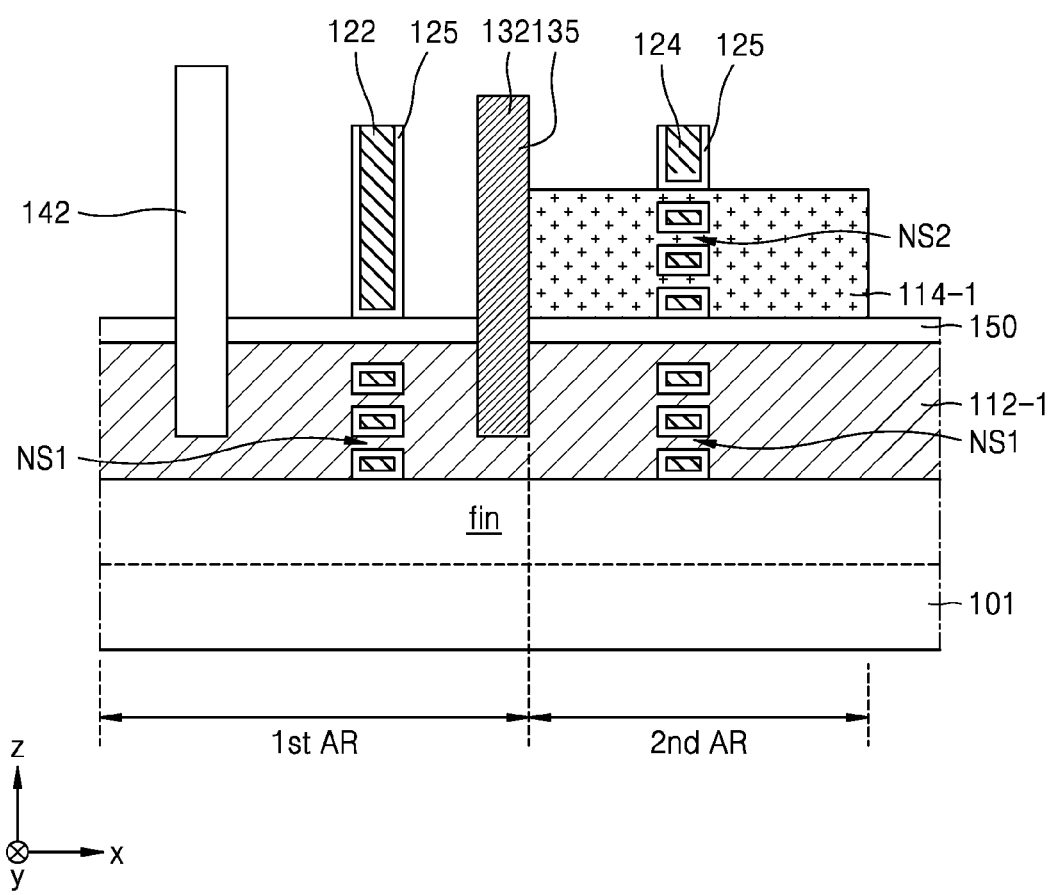
Figure 3B:
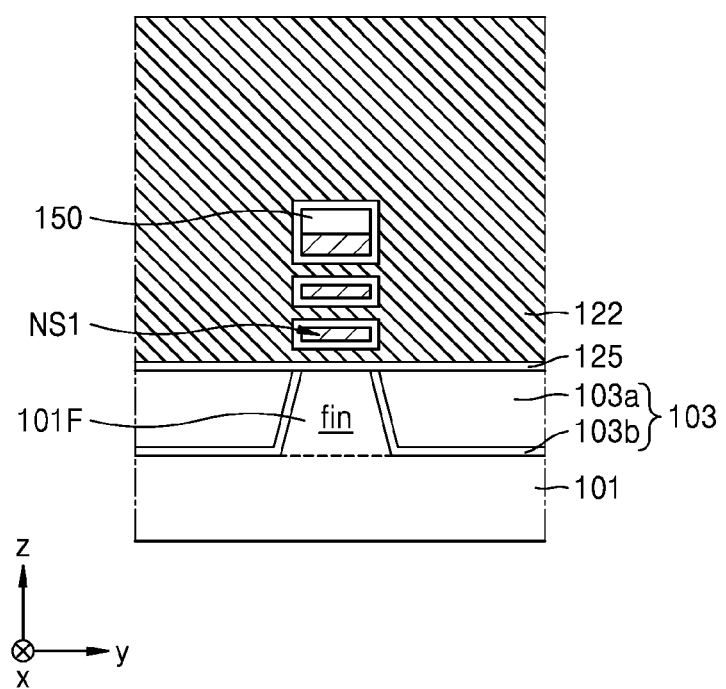
Figure 3C:
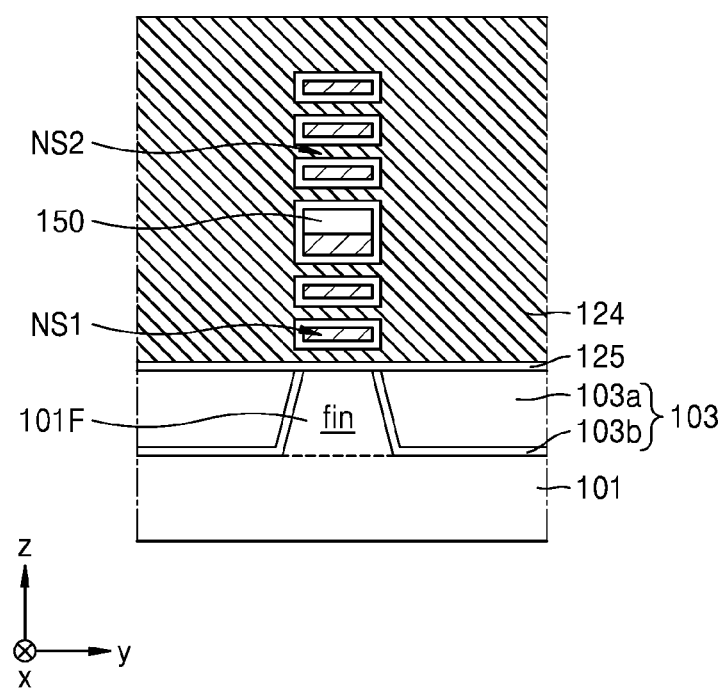
Figure 3D:
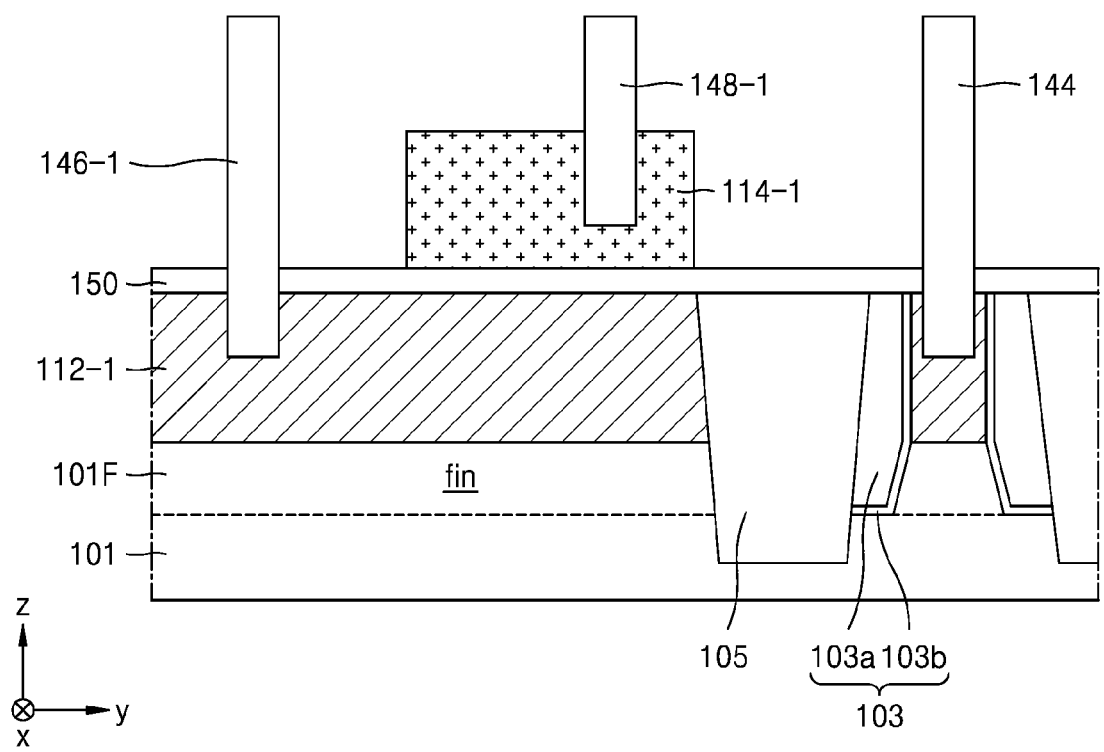

FIG. 2 is a layout diagram illustrating an SRAM device including a 3DS FET according to an embodiment of the inventive concept. FIGS. 3A to 3D are cross-sectional views illustrating the SRAM device of FIG. 2. FIG. 3A is a cross-sectional view taken along line I-I', FIG. 3B is a cross-sectional view taken along line II-II', FIG. 3C is a cross-sectional view taken along line III-III', and FIG. 3D is a cross-sectional view taken along line IV-IV'.

Referring to FIGS. 2, and 3A to 3D, FIG. 2 illustrates a layout of a one-bit unit cell (i.e., one-bit SRAM unit cell) in the SRAM device 100 according to an embodiment. A dot-lined rectangular portion may correspond to the one-bit unit cell. The unit cell may include first and second fin active regions 110-1 and 110-2 in which active layers are formed to provide channels and source/drains for transistors, four gates 120 (i.e., four gate electrodes of the transistors), and two nodes 130. In some embodiments, two fin active regions 110-1 and 110-2 per the one-bit unit cell, four gates 120 per the one-bit cell, and two nodes 130 per the one-bit unit cell may be used. The unit cell may further include a plurality of contacts 141, 142, 144, 146, and 148, and a first metal layer (refer to M1 of FIG. 9B) and a second metal layer (refer to M2 of FIG. 9C) connected to the plurality of contacts 141, 142, 144, 146, and 148. The first metal layer M1 and the second metal layer M2 will be described in more detail with reference to FIGS. 9A to 9E.

The first fin active region 110-1 may include a first active region that extends on a semiconductor substrate 101 in a first direction (an x direction) and a second active region that extends on the semiconductor substrate 101 in a second direction (a y direction) that is perpendicular to the first direction. In some embodiments, the first fin active region 110-1 may be disposed on a fin 101F of the semiconductor substrate 101. The fin 101F may be formed 1) by epitaxially growing from the semiconductor substrate 101 or 2) by etching the semiconductor substrate 101. For example, the fin 101F may protrude from a main surface of the semiconductor substrate 101. In some embodiments, the first fin active region 110-1 may include a first lower layer 112-1 and a first upper layer 114-1. Unless described otherwise, the first fin active region 110-1 refers to at least one fin active layer in which a channel and a pair of source/drains are formed to constitute a transistor. The semiconductor substrate 101 may include or may be formed of silicon (Si), for example, single crystalline Si, polycrystalline Si, or amorphous Si. However, a material of the semiconductor substrate 101 is not limited to Si. For example, in some embodiments, the semiconductor substrate 101 may include or may be formed of a group IV semiconductor such as germanium (Ge), a group IV-IV compound semiconductor such as SiGe and silicon carbide (SiC), and a group III-V compound semiconductor such as gallium arsenide (GaAs), indium arsenide (InAs), and indium phosphide (InP).

A shallow trench isolation (STI) 103 defining a fin of the first fin active region 110-1 and an isolation layer 105 defining a device region may be formed in the semiconductor substrate 101. The isolation layer 105 may be deeper than the STI 103. The STI 103 may include or may be formed of an insulation liner 103b and a gap-fill insulating layer 103a on the insulation liner 103b. The insulation liner 103b, the gap-fill insulating layer 103a, and the isolation layer 105 may include or may be formed of an oxide layer, a nitride layer, or a combination of the above layers. In some embodiments, the isolation layer 105 and the gap-fill insulating layer 103a may include or may be formed of the same material as each other.

The first lower layer 112-1 and the first upper layer 114-1 may be arranged in the first fin active region 110-1 of the unit cell, and the isolation insulating layer 150 may be between the first lower layer 112-1 and the first upper layer 114-1 so that the first lower layer 112-1 and the first upper layer 114-1 may be electrically insulated from each other. The first lower layer 112-1 and the first upper layer 114-1 may include source/drain regions of a transistor as a region doped with higher density than the fin 101F under the first fin active region 110-1. In some embodiments, in FIGS. 3A and 3D, the first lower layer 112-1 is distinguished from the fin 101F thereunder (i.e., may be spaced apart from the fin 101F). In some embodiments, in the first lower layer 112-1 and the first upper layer 114-1, only portions neighboring opposite sides of each of the four gates 120 may be doped with high density and portions away from the four gates 120 may be doped with the same density as that of the fin under the first lower layer 112-1 and the first upper layer 114-1 while maintaining shapes of nano-sheets. For example, each of the first lower layer 112-1 and the first upper layer 114-1 may have at least two nano-sheets where a gate overlap the fin 101F, and the gate may surrounds each of the at least two nano-sheets as shown in FIGS. 3A to 3C.

Figure 4A:
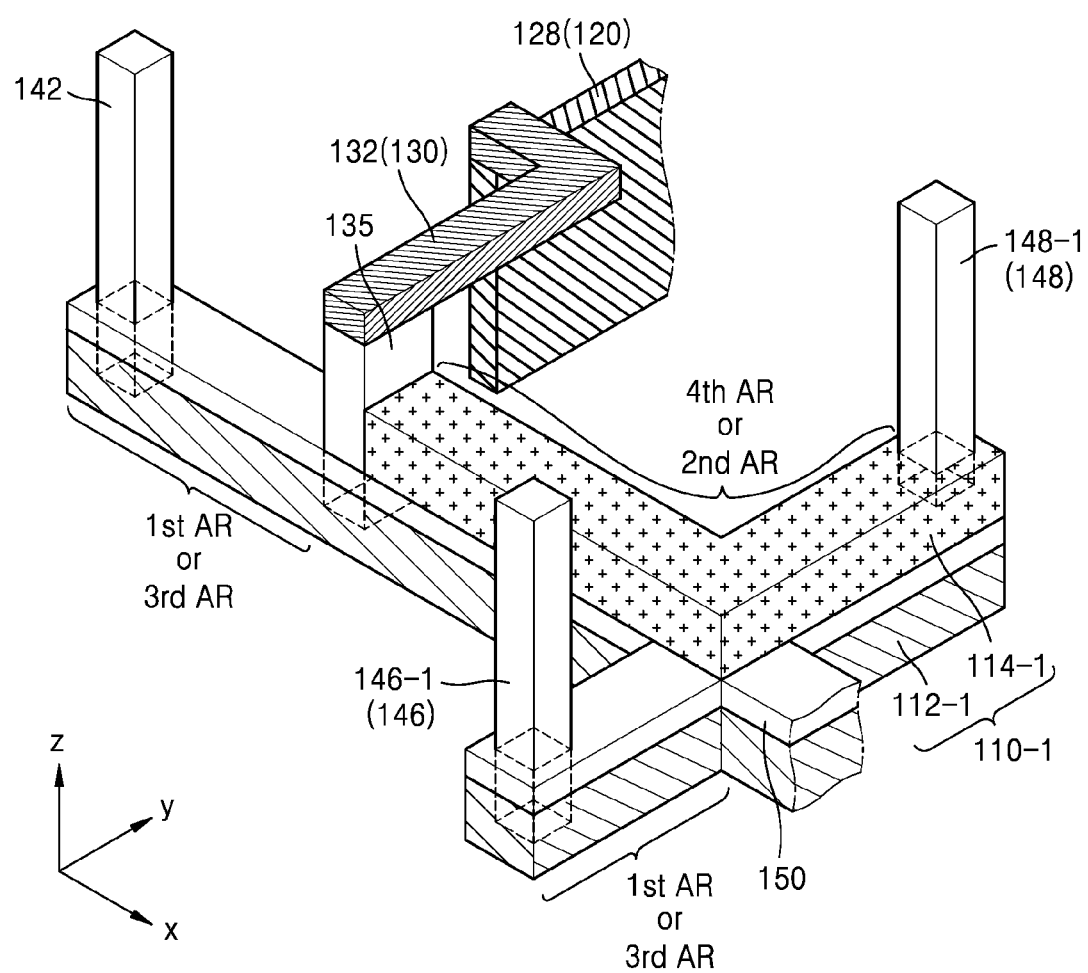
FIGS. 4A to 4D are perspective views illustrating main portions of the SRAM device of FIG. 2.
Figure 4B:
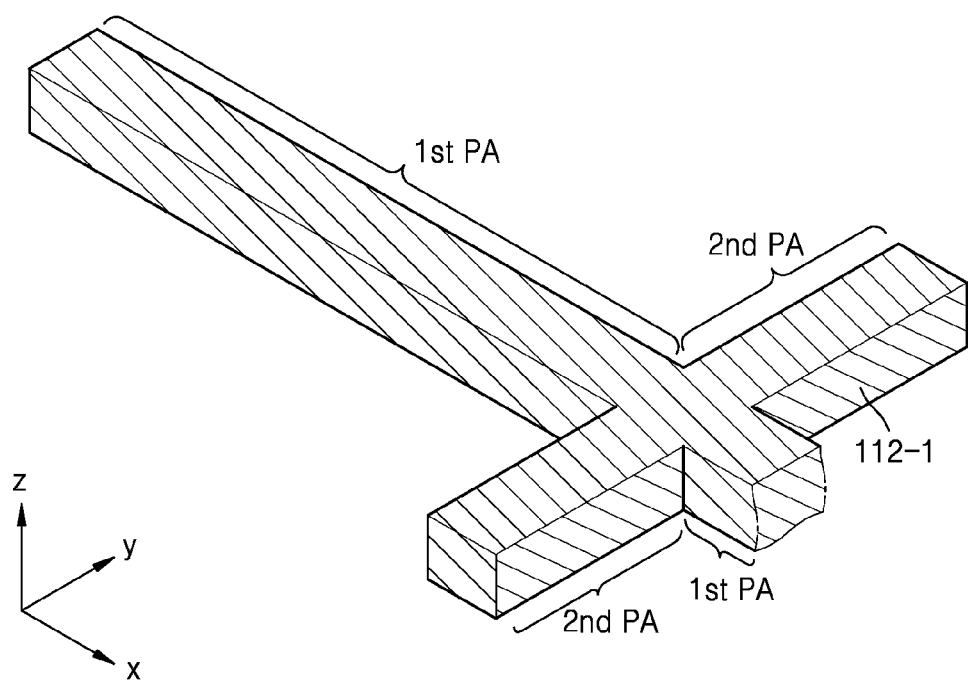

The first lower layer 112-1 may include a first portion 1st PA of FIG. 4B extending in the first direction (i.e., the x direction) and a second portion 2nd PA of FIG. 4B extending from the right end of the first portion in the first direction (the x direction) upward and downward in the second direction (i.e., the y direction) on a plane. The first upper layer 114-1 may include a third portion 3rd PA of FIG. 4C extending in the first direction (the x direction) and a fourth portion 4th PA' of FIG. 4C extending from the right end of the third portion in the first direction (the x direction) upward in the second direction (the y direction) on a plane. In some embodiments, the third portion 3rd PA of the first upper layer 114-1 may be shorter than the first portion 1st PA of the first lower layer 112-1. The fourth portion 4th PA of the first upper layer 114-1 and the second portion 2nd PA of the first lower layer 112-1 may be arranged at the same position in the first direction (the x direction). For example, the fourth portion 4th PA of the first upper layer 114-1 may overlap the second portion 2nd PA of the first lower layer 112-1. Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

In the SRAM device 100 according to an embodiment, in the above-described structure, the first upper layer 114-1 may exactly overlap a part of the first lower layer 112-1. For example, the first upper layer 114-1 does not overlap a left portion, in the first direction, of the first portion 1st PA, and a lower portion, in the second direction, of the second portion 2nd PA. The first fin active region 110-1 may be divided into a first region 1st AR in which only the first lower layer 112-1 is arranged and a second region 2nd AR in which the first upper layer 114-1 is arranged on the first lower layer 112-1, that is, the first upper layer 114-1 is stacked on the first lower layer 112-1 to overlap the first lower layer 112-1. For example, the first region 1st AR of the first fin active region 110-1 may be formed of a single active layer (e.g., the first lower layer 112-1), and the second region 2nd AR of the first fin active region 110-1 may be formed of two active layers (e.g., the first lower layer 112-1 and the first upper layer 114-1) stacked on each other. The two active layers in the second region 2nd AR of the first fin active region may be separated from each other by the isolation insulating layer 150.

The second fin active region 110-2 and the first fin active region 110-1 may be in a point symmetry with respect to the center of the unit cell. In some embodiments, the second fin active region 110-2 have the same structure, size, and shape as the first fin active region 110-1, and thus an object obtained by rotating the first fin active region 110-1 180 degrees with respect to the center of the unit cell may exactly overlap the second fin active region 110-2. Description of a detailed structure of the second fin active region 110-2 will not be given. In order to distinguish the second fin active region 110-2 from the first fin active region 110-1, the second fin active region 110-2 is differently expressed as a third region (refer to '3rd AR' of FIG. 4A) in which only a second lower layer 112-2 is arranged and a fourth region (refer to '4th AR' of FIG. 4A) in which a second upper layer 114-2 is arranged on the second lower layer 112-2.

Furthermore, in a layout in which unit cells are arranged in a two-dimensional array structure, the first fin active region 110-1 may correspond to ¼ of the first fin active region 110-1 included in a 4-bit cell and the second fin active region 110-2 may correspond to ¼ of the second fin active region 110-2 included in a 4-bit cell, which will be described in more detail with reference to FIGS. 9A to 9E.

The four gates 120 may include first to fourth gates 122, 124, 126, and 128 (i.e., first to fourth gate electrodes) and may extend in a second direction (a y direction). For example, the first gate 122 may intersect a first portion 1st PA of the first region 1st AR of the first fin active region 110-1, the second gate 124 may intersect a third portion 3rd PA of the second region 2nd AR of the first fin active region 110-1, the third gate 126 may intersect a first portion 1st PA of the third region 3rd AR of the second fin active region 110-2, and the fourth gate 128 may intersect a third portion 3rd PA of the fourth region 4th AR of the second fin active region 110-2.

The first fin active region 110-1 and the second fin active region 110-2 may include first and second nano-sheets NS1 and NS2 at a portion intersecting the four gates 120. For example, the first region 1st AR may include the first nano-sheets NS1 at the intersections between the first region 1st AR and the first gate 122, and the third region 3rd AR may include the first nano-sheets NS1 at the intersections between the third region 3rd AR and the third gate 126. The first nano-sheets NS1 of the first region 1st AR may be formed at an intersection between the first lower layer 112-1 and the first gate 122, and the first nano-sheets NS1 of the third region 3rd AR may be formed at an intersection between the second lower layer 112-2 and the third gate 126. The second region 2nd AR may include the first nano-sheets NS1 and the second nano-sheets NS2 at the intersections between the second region 2nd AR and the second gate 124, and the fourth region 4th AR may include the first nano-sheets NS1 and the second nano-sheets NS2 at the intersections between the fourth region 4th AR and the fourth gate 128. The first nano-sheets NS1 of the second region 2nd AR may be formed at an intersection between the second gate 124 and the first lower layer 112-1, and the second nano-sheets NS2 of the second region 2nd AR may be formed at an intersection between the second gate 124 and the first upper layer 114-1. The first nano-sheets NS1 of the fourth region 4th AR may be formed at an intersection between the fourth gate 128 and the second lower layer 112-2, and the second nano-sheets NS2 of the fourth region 4th AR may be formed at an intersection between the fourth gate 128 and the second upper layer 114-2.

Hereinafter, referring to FIGS. 3A to 3D, with the first fin active region 110-1, the first gate 122, and the second gate 124, structures of the first and second nano-sheets NS1 and NS2 and a gate all around (GAA) structure will be described in more detail.

The first and second nano-sheets NS1 and NS2 of the first active region 110-1 may be arranged on the fin 101F of the semiconductor substrate 101. For example, the first nano-sheets NS1 may be arranged in the first lower layer 112-1 of the first fin active region 110-1 and the second nano-sheets NS2 may be arranged in the first upper layer 114-1 of the first fin active region 110-1. The three first nano-sheets NS1 are arranged in the first lower layer 112-1 and the three second nano-sheets NS2 are arranged in the first upper layer 114-1. However, each of the number of first nano-sheets NS1 and the number of second nano-sheets NS2 is not limited to 3. Each of the first nano-sheets NS1 and the second nano-sheets NS2 may have a sheet structure. For example, as illustrated in FIG. 3B or 3C, in the sheet structure, each of the first nano-sheets NS1 and the second nano-sheets NS2 has a thickness of several nanometers (nm) in a third direction (a z direction) and has a width of several to decades nanometers in the first direction (the x direction) and the second direction (the y direction). A size of each of the first nano-sheets NS1 and the second nano-sheets NS2 is not limited to the above-described numerical values.

The first nano-sheets NS1 may be formed in portions covered with the first gate 122 in the first lower layer 112-1 on the fin of the first fin active region 110-1. The first nano-sheets NS1 and the second nano-sheets NS2 may be formed in portions covered with the second gate 124 in the first lower layer 112-1 and the first upper layer 114-1 on the fin of the first fin active region 110-1. The first nano-sheets NS1 and the second nano-sheets NS2 may include channel regions. For example, in FIG. 3A, when the first lower layer 112-1 arranged on opposite sides of the first gate 122 serves as the source/drain regions, the first nano-sheets NS1 may be arranged between the source/drain regions and may operate as the channel regions. When the first lower layer 112-1 and the first upper layer 114-1 arranged on opposite sides of the second gate 124 serves as the source/drain regions, the first nano-sheets NS1 may be arranged between the source/drain regions of the first lower layer 112-1 and may operate as the channel regions and the second nano-sheets NS2 may be arranged between the source/drain regions of the first upper layer 114-1 and may operate as the channel regions.

As illustrated in FIGS. 3B and 3C, the first nano-sheets NS1 and the second nano-sheets NS2 may have a GAA structure in which four sides of each of the first nano-sheets NS1 and the second nano-sheets NS2 are surrounded by the first and second gates 122 and 124. For example, a top surface, a bottom surface, and sides in the second direction (the y direction) of each of the first nano-sheets NS1 and the second nano-sheets NS2 are surrounded by the first and second gates 122 and 124. Therefore, a width of each of channel regions including the first and second nano-sheets NS1 and NS2 may correspond to a length of four sides of each of the channel regions. In some embodiments, when the thickness of each of the first and second nano-sheets NS1 and NS2 is maintained to be very small, for example, about several nanometers, quantum confinement effect may be obtained. By using the quantum confinement effect, a threshold voltage Vth of a transistor may be controlled. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The first and second gates 122 and 124 may respectively intersect the first portion 1st PA of the first region 1st AR and the third portion 3rd PA of the second region 2nd AR of the first fin active region 110-1 on the semiconductor substrate 101 and may extend in the second direction (the y direction). Specifically, the first gate 122 may be arranged in the first portion 1st PA and the second gate 124 may be arranged in the third portion 3rd PA.

The first gate 122 may surround each of the first nano-sheets NS1. The second gate 124 may surround each of the first nano-sheets NS1 and each of the second nano-sheets NS2. For example, the first gate 122 may cover a top surface, a bottom surface, and sides in the second direction (the y direction) of each of the three first nano-sheets NS1. The first gate 122 may include a main gate arranged on the first nano-sheets NS1 and a plurality of sub-gates connected to the main gate and arranged between the first nano-sheets NS1 and on the sides of the first nano-sheets NS1. For example, in FIG. 3A, a portion of the first gate 122 arranged on the isolation insulating layer 150 may correspond to the main gate of the first gate 122 and other portions of the first gate 122 arranged under the isolation insulating layer 150 may correspond to the plurality of sub-gates of the first gate 122. A portion of the second gate 124 arranged on the first upper layer 114-1 may correspond to a main gate of the second gate 124 and other portions of the second gate 124 arranged under the main gate may correspond to a plurality of sub-gates of the second gate 124. As noted from FIG. 3A, a thickness of each of the plurality of sub-gates may be less than a thickness of the main gate. As noted from FIGS. 3A to 3C, any sub-gate of the plurality of sub-gates may not be arranged in the isolation insulating layer 150.

In some embodiments, a gate insulating layer 125 may be arranged between the first gate 122 and each of the first nano-sheets NS1, and between the second gate 124 and each of the first nano-sheets NS1 and each of the second nano-sheets NS2. The gate insulating layer 125 may have a stacked structure of an interfacial layer and a high-k layer. The interfacial layer may cure interfacial defects between the first fin active region 110-1 and the first and second nano-sheets NS1 and NS2 and the high-k layer on a top surface of the first fin active region 110-1 and the surfaces of the first and second nano-sheets NS1 and NS2. In some embodiments, the interfacial layer may be omitted. The high-k layer may include or may be formed of a material having a greater dielectric constant than a dielectric constant of a silicon oxide (SiO) layer. For example, the high-k layer may have a dielectric constant of about 10 to about 25.

Each of the first and second gates 122 and 124 may include a work function control metal containing layer and a gap-fill metal containing layer filling an upper space of the work function control metal containing layer. In some embodiments, each of the first and second gates 122 and 124 may have a structure in which a metal nitride layer, a metal layer, a conductive capping layer, and a gap-fill metal layer are sequentially stacked on each other. In some embodiments, each of the first and second gates 122 and 124 may have a stacked structure of TiAlC/TiN/W, a stacked structure of TiN/TaN/TiAlC/TiN/W, or a stacked structure of TiN/TaN/TiN/TiAlC/TiN/W.

The first fin active region 110-1 may include the source/drain regions including the first lower layer 112-1 and the first upper layer 114-1 on opposite sides of each of the first and second gates 122 and 124 in the first direction (the x direction). The source/drain regions may be connected to neighboring first and second nano-sheets NS1 and NS2. The source/drain regions may include or may be formed of a semiconductor layer epitaxial grown from the first and second nano-sheets NS1 and NS2. For example, the source/drain regions may include or may be formed of an epitaxial grown Si layer, an epitaxial grown SiC layer, or an epitaxial grown SiGe layer. The SiGe layer may have an embedded SiGe structure including a plurality of SiGe layers.

Although not shown in FIG. 3A, first gate spacers covering opposite side walls of each of the first and second gates 122 and 124 in the first direction (the x direction) may be arranged. Each of the first gate spacers may include a plurality of layers. For example, each of the first gate spacers may sequentially include an insulation liner, an insulation spacer, and a protective layer from inside to outside. Each of the insulation liner, the insulation spacer, and the protective layer may include or may be a silicon nitride (SiN) layer. However, the inventive concept is not limited thereto. The first gate spacers may cover side walls of the main gate of each of the first and second gates 122 and 124.

In spaces among the first and second nano-sheets NS1 and NS2, second gate spacers may be arranged between the plurality of sub-gates and the source/drain regions. The second gate spacers may cover side walls of at least some of the plurality of sub-gates. Opposite side walls of the lowermost sub-gate may be covered with a buffer semiconductor layer covering the fin of the first fin active region 110-1. The buffer semiconductor layer may include or may be formed of a material different from a material of the first fin active region 110-1. For example, the first fin active region 110-1 may include or may be formed of Si and the buffer semiconductor layer may include or may be formed of Ge.

In the SRAM device 100 according to some embodiments, the first gate 122 and the first region 1st AR of the first fin active region 110-1 may configure the first pass transistor PT1 and the second gate 124 and the second region 2nd AR of the first fin active region 110-1 may configure the first pull-down transistor PDT1 and the first pull-up transistor PUT1. For example, the second gate 124 and the first lower layer 112-1 of the second region 2nd AR may configure the first pull-down transistor PDT1 and the second gate 124 and the first upper layer 114-1 of the second region 2nd AR may configure the first pull-up transistor PUT1. The third gate 126 and the third region 3rd AR of the second fin active region 110-2 may configure the second pass transistor PT2 and the fourth gate 128 and the fourth region 4th AR of the second fin active region 110-2 may configure the second pull-down transistor PDT2 and the second pull-up transistor PUT2.

The nodes 130 may include a first node 132 and a second node 134. The first node 132 may connect the fourth gate 128 to the first lower layer 112-1 and the first upper layer 114-1 of the second region 2nd AR of the first fin active region 110-1. The first node 132 may also be connected to the first lower layer 112-1 of the first region 1st AR of the first fin active region 110-1. The second node 134 may connect the second gate 124 to the second lower layer 112-2 and the second upper layer 114-2 of the fourth region 4th AR of the second fin active region 110-2 and may also be connected to the second lower layer 112-2 of the third region 3rd AR of the second fin active region 110-2.

As a result, the first node 132 may correspond to a wiring line connecting gates of the second pull-up transistor PUT2 and the second pull-down transistor PDT2 to the source/drain regions of the first pass transistor PT1. The first node 132 may also connect the gates of the second pull-up transistor PUT2 and the second pull-down transistor PDT2 to the source/drain regions of the first pull-up transistor PUT1 and the source/drain regions of the first pull-down transistor PDT1, respectively. The second node 134 may correspond to a wiring line connecting gates of the first pull-up transistor PUT1 and the first pull-down transistor PDT1 to the source/drain regions of the second pass transistor PT2 and may also connect the gates of the first pull-up transistor PUT1 and the first pull-down transistor PDT1 to the source/drain regions of the second pull-up transistor PUT2 and the second pull-down transistor PDT2. A structure of each of the nodes 130 will be described in more detail with reference to FIGS. 4A, 5A, and 5B.

The plurality of contacts 141, 142, 144, 146, and 148 may include the gate contact 141, the bit line contact 142, the bit line bar contact 144, the ground contacts 146, and the power contacts 148. The gate contact 141 may connect the four gates 120 to a word line (refer to M21 of FIG. 9C). For reference, because the second gate 124 and the fourth gate 128 are connected to source/drain regions of another transistor, the second and fourth gates 124 and 128 may not include gate contacts. For example, the second gate 124 and the fourth gate 128 are connected to source/drain regions of another transistor without using gate contacts.

The bit line contact 142 may be arranged in the first lower layer 112-1 on the left of the first gate 122 in the first region 1st AR of the first fin active region 110-1. The bit line contact 142 may connect the source/drain regions of the first pass transistor PT1 to a bit line (refer to M11 of FIG. 9B). The bit line bar contact 144 may be arranged in the second lower layer 112-2 on the right of the third gate 126 in the third region 3rd AR of the second fin active region 110-2. The bit line bar contact 144 may connect the source/drain regions of the second pass transistor PT2 to a bit line bar (refer to the bit line bar M12 of FIG. 9B).

The ground contacts 146 may include a first ground contact 146-1 connected to the first fin active region 110-1 and a second ground contact 146-2 connected to the second fin active region 110-2. The first ground contact 146-1 may be disposed on a portion, extending downward along a straight line extending in the second direction (the y direction), of the second portion 2nd PA of the first lower layer 112-1 of the first fin active region 110-1. The second ground contact 146-2 may be disposed on a portion, extending upward along a straight line extending in the second direction (the y direction) of the second portion 2nd PA of the second lower layer 112-2 of the second fin active region 110-2. The ground contacts 146 may connect the source/drain regions of the first pull-down transistor PDT1 and the second pull-down transistor PDT2 to a ground line (refer to M22 of FIG. 9C).

The power contacts 148 may include a first power contact 148-1 connected to the first fin active region 110-1 and a second power contact 148-2 connected to the second fin active region 110-2. The first power contact 148-1 may be arranged in the fourth portion 4th PA of the first upper layer 114-1 of the first fin active region 110-1. The second power contact 148-2 may be arranged in the fourth portion 4th PA of the second upper layer 114-2 of the second fin active region 110-2. The power contacts 148 may connect the source/drain regions of the first pull-up transistor PUT1 and the second pull-up transistor PUT2 to a power line (refer to M13 of FIG. 9B).

The plurality of contacts 141, 142, 144, 146, and 148 may pass through an interlayer insulating layer formed on the semiconductor substrate 101 to be connected to corresponding components. Each of the plurality of contacts 141, 142, 144, 146, and 148 may include or may be formed of, for example, tungsten (W), copper (Cu), aluminum (Al), titanium (Ti), tantalum (Ta), titanium nitride (TiN), tantalum nitride (TaN), an alloy of the above metals, or a combination of the above metals. However, a material of each of the plurality of contacts 141, 142, 144, 146, and 148 is not limited thereto. When the corresponding components include or are formed of Si, a metal silicide layer may be arranged between the plurality of contacts 141, 142, 144, 146, and 148 and the corresponding components.

In the SRAM device 100 according to some embodiments, the one-bit unit cell may include the first and second fin active regions 110-1 and 110-2, the four gates 120, and the two nodes 130 arranged in the above-described structure and may be based on the 3DS FET so that the planar area of the unit cell may be minimized. A wiring connection structure between the corresponding components and the metal layer thereon may be simplified. For example, a connection structure between the plurality of contacts 141, 142, 144, 146, and 148 arranged on the corresponding components and the first metal layer M1 or the second metal layer M2 may be simplified. Therefore, it is possible to prevent process difficulty from increasing and to prevent neighboring wiring lines from being short-circuited due to a complicated wiring connection structure. As a result, a size of the SRAM device 100 according to some embodiments may be minimized and reliability thereof may increase. For example, a first end of the first node 132 may be connected to or contact the fourth gate 128, and a second end of the first node 132 may be connected to both the first lower layer 112-1 and the first upper layer 114-1 of the second region 2nd AR of the first fin active region 110-1 via a node contact 135 as shown in FIG. 3A (see also FIG. 4A). In some embodiments, a portion of the node contact 135 may be buried in the first lower layer 112-1, and another portion of the node contact 135 may contact a side surface of the first upper layer 114-1. When viewed in a plan view, a boundary line between the first node 132 and the first upper layer 114-1 may correspond to a boundary between the first region 1st AR and the second region 2nd AR. The present invention is not limited thereto. In some embodiments, the node contact 135 and the first node 132 may be integrally formed as a first node connecting the fourth gate 128 to each of the first lower layer 112-1 and the first upper layer 114-1. In some embodiments, the node contact 135 and the first node 132 may include or may be formed of the same conductive material (e.g., W) as each other. In some embodiments, the node contact 135 may be omitted as shown in FIGS. 5B and 5C.

Figure 4C:
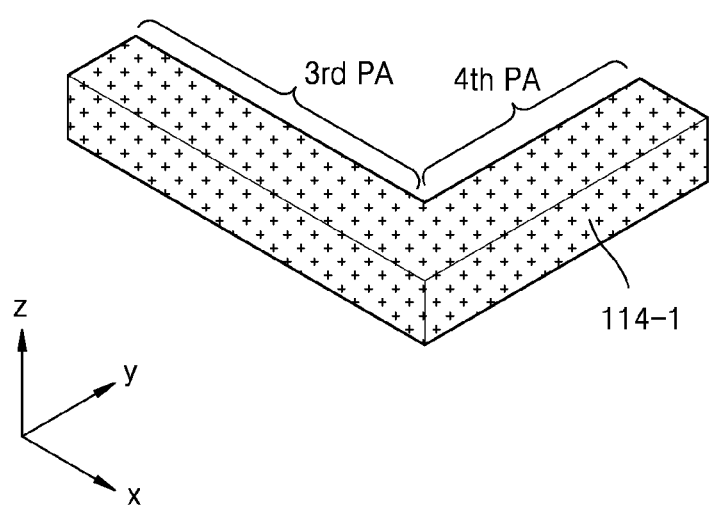
Figure 4D:
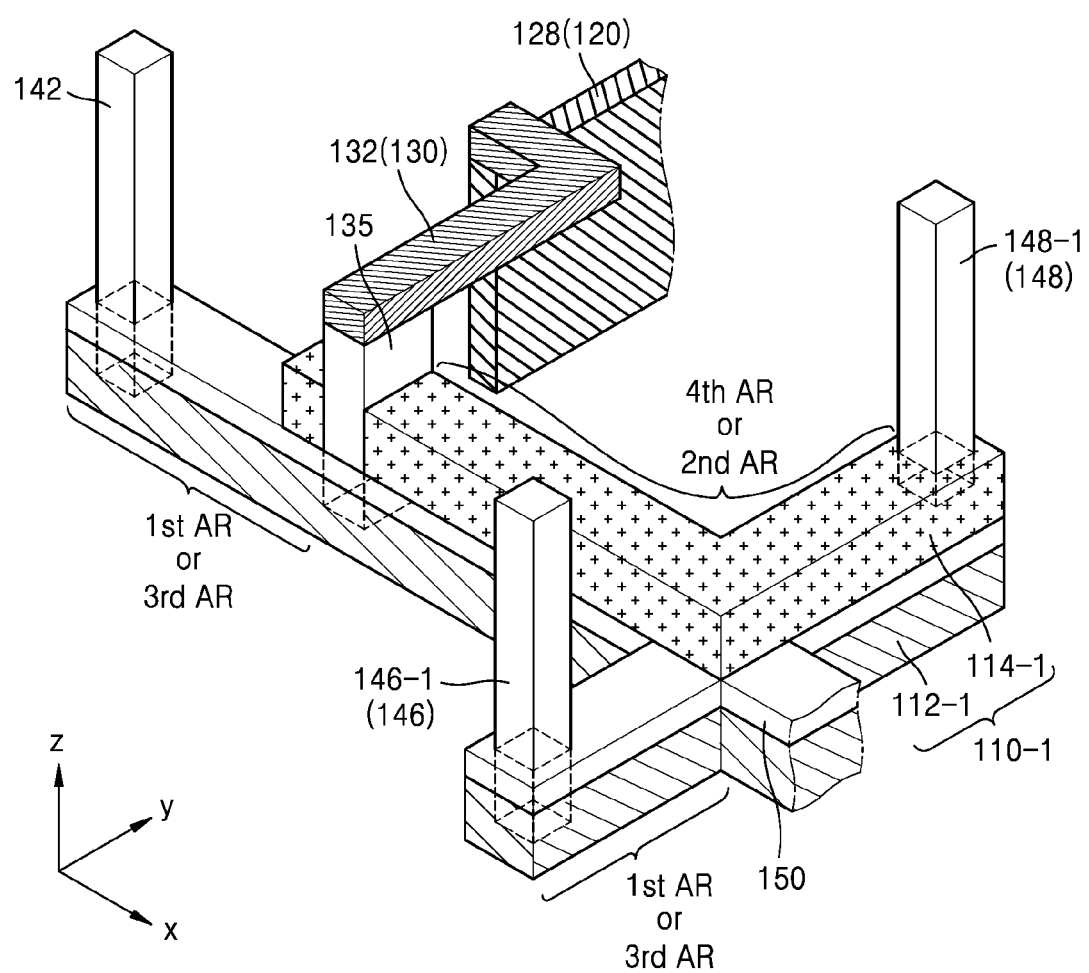

FIGS. 4A to 4D are perspective views illustrating main portions of the SRAM device of FIG. 2. FIG. 4B is a perspective view of the first lower layer 112-1 of the first fin active region 110-1 of FIG. 4A. FIG. 4C is a perspective view of the first upper layer 114-1 of the first fin active region 110-1 of FIG. 4A. FIG. 4D is a perspective view illustrating another connection structure between the first fin active region 110-1 and the first node 132. Description previously given with reference to FIGS. 1 to 3D will be simply given or will be omitted.

Referring to FIGS. 4A to 4C, FIG. 4A three-dimensionally illustrates the structure in which the fourth gate 128 is connected to the first fin active region 110-1 through the first node 132. The first fin active region 110-1 may include the first lower layer 112-1 and the first upper layer 114-1. The first lower layer 112-1 may include the first portion 1st PA extending in the first direction (the x direction) and the second portion 2nd PA extending upward and downward in the second direction (the y direction) as illustrated in FIG. 4B. The first upper layer 114-1 may include the third portion 3rd PA extending in the first direction (the x direction) and the fourth portion 4th PA extending upward in the second direction (the y direction) as illustrated in FIG. 4C. The portion, extending downward along a straight line extending in the second direction, of the second portion 2nd PA of the first lower layer 112-1 may further extend and may be connected to a second portion 2nd PA of a first lower layer 112-1 of a first fin active region 110-1 of another unit cell adjacent to the unit cell in the second direction (the y direction).

In the first fin active region 110-1, the first upper layer 114-1 may be stacked on the first lower layer 112-1 with the isolation insulating layer 150 between the first lower layer 112-1 and the first upper layer 114-1. Based on such a stacked structure, the first fin active region 110-1 may be divided into the first region 1st AR in which only the first lower layer 112-1 is arranged and the second region 2nd AR in which the first upper layer 114-1 is arranged on the first lower layer 112-1.

The fourth gate 128 may be connected to the first lower layer 112-1 and the first upper layer 114-1 of the first fin active region 110-1 through the first node 132 and a node contact 135. The node contact 135 may be arranged at the left end of the second region 2nd AR, may be connected to a side of the first upper layer 114-1, and may be connected to the first lower layer 112-1 through the isolation insulating layer 150. In some embodiments, the first node 132 having a shape obtained by rotating 'L' 180 degrees may connect the fourth gate 128 to the node contact 135.

Figure 9A:
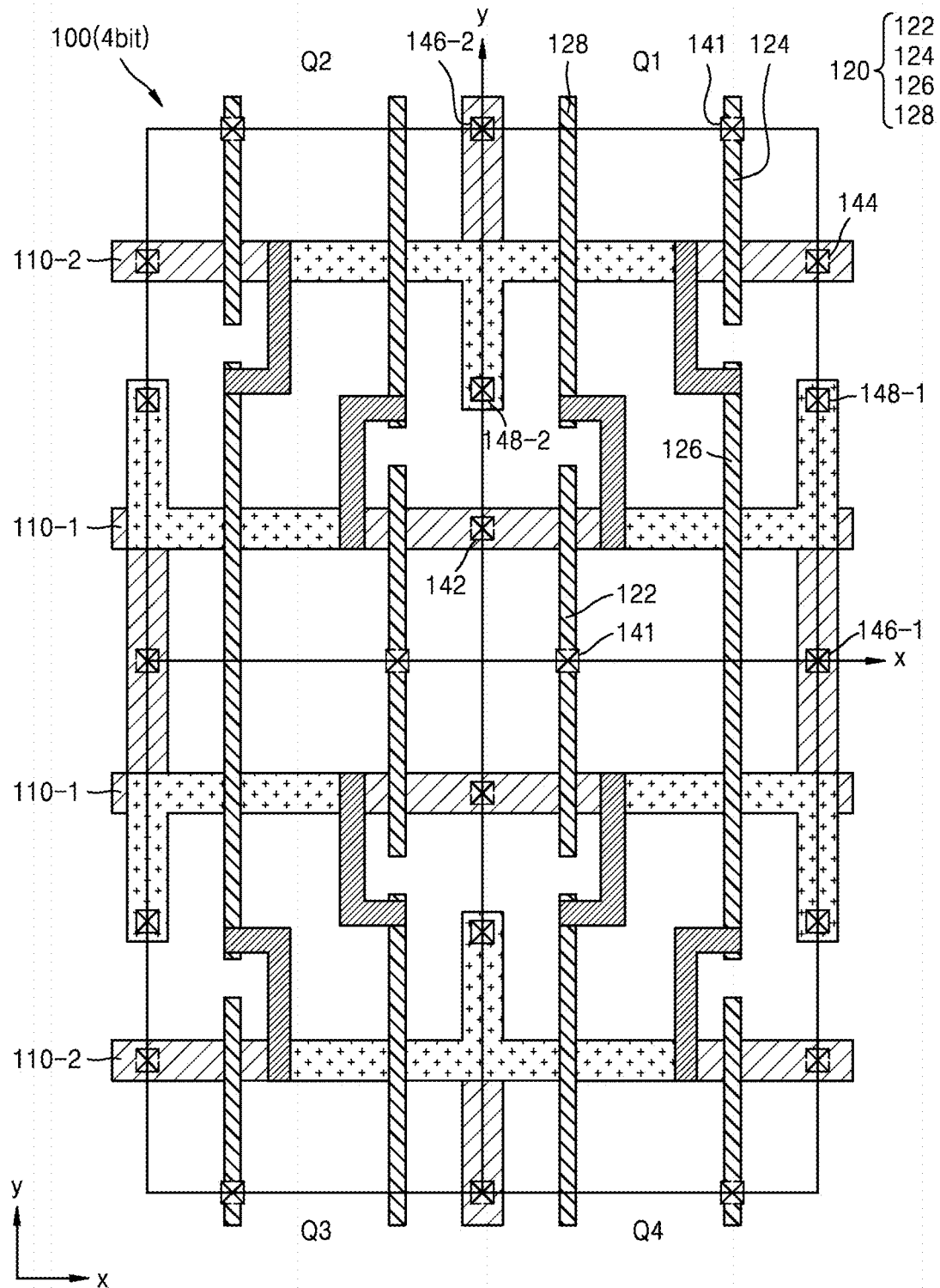
FIGS. 9A to 9E are layout diagrams and cross-sectional views illustrating an enlargement of the SRAM device of FIG. 2 to a 4-bit SRAM device.
Figure 9B:
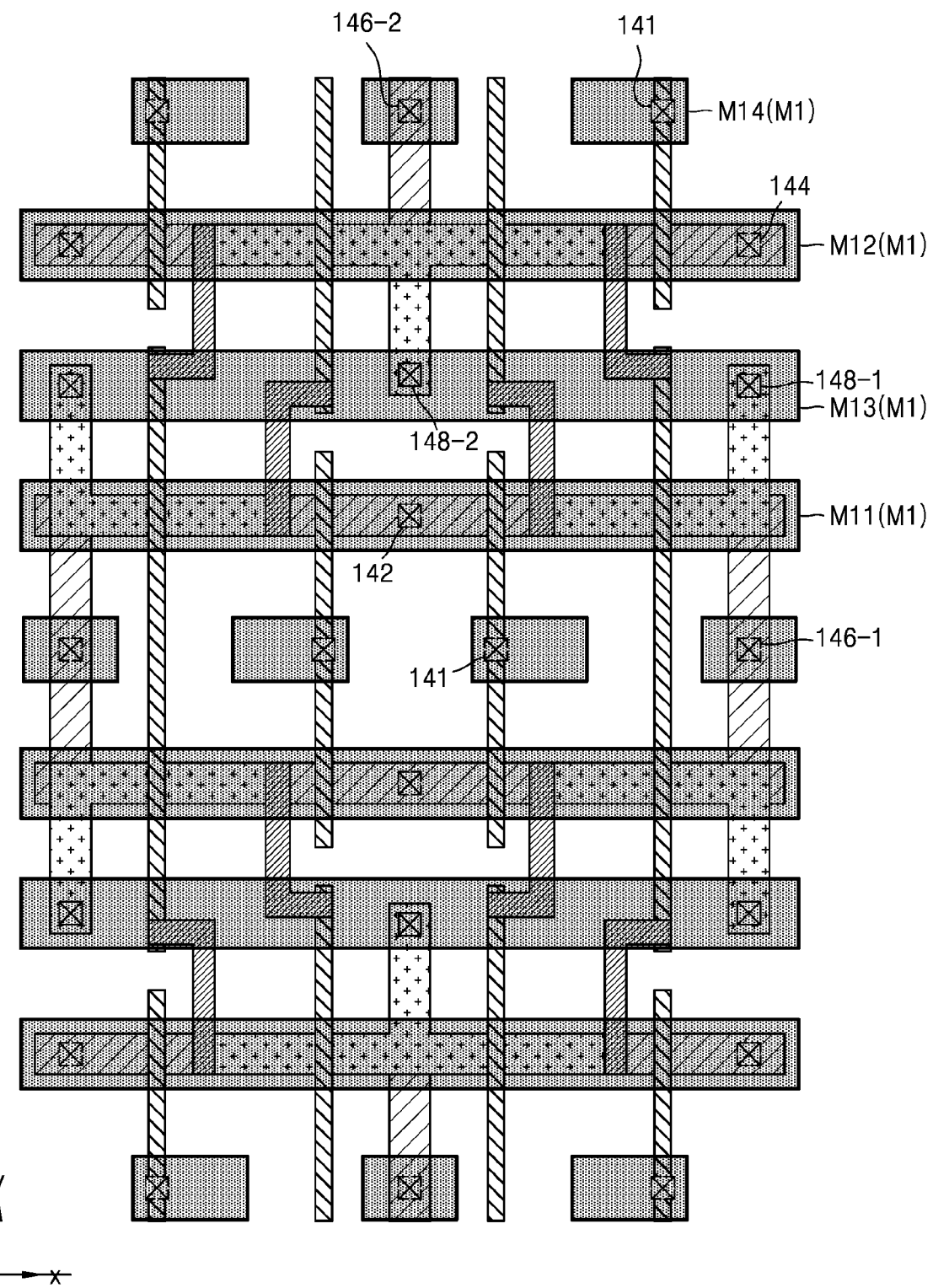
Figure 9C:
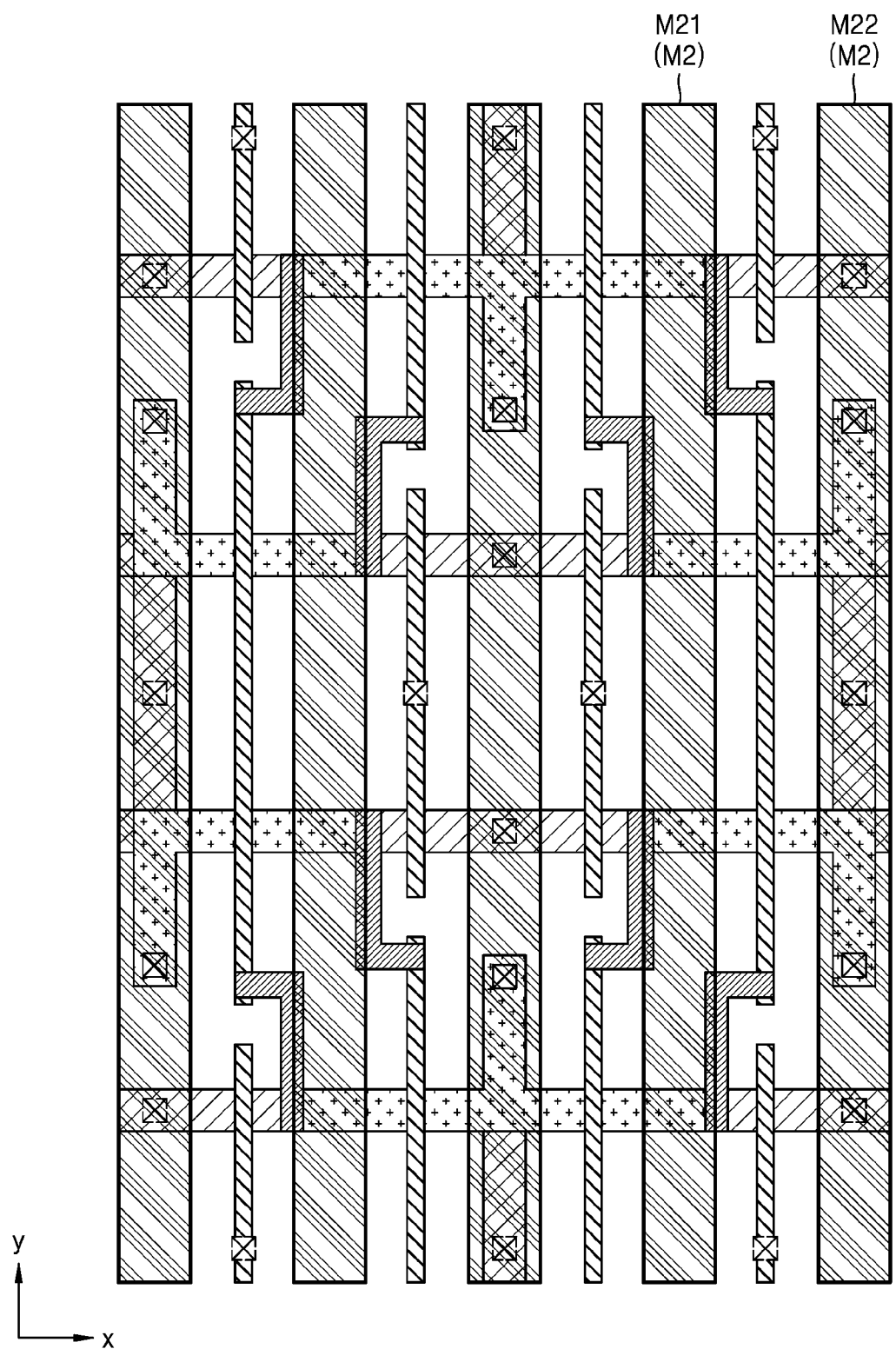
Figure 9D:
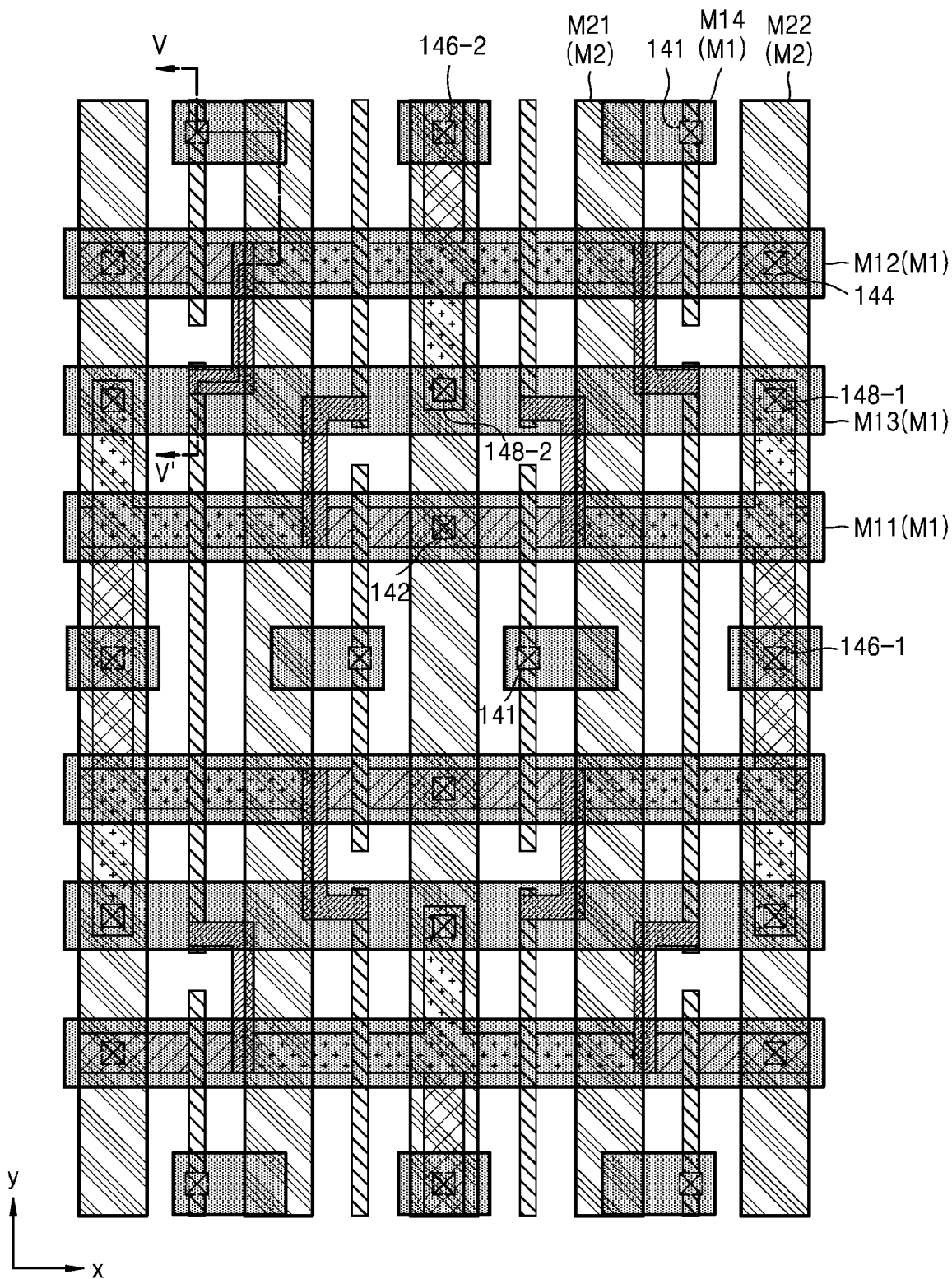
Figure 9E:
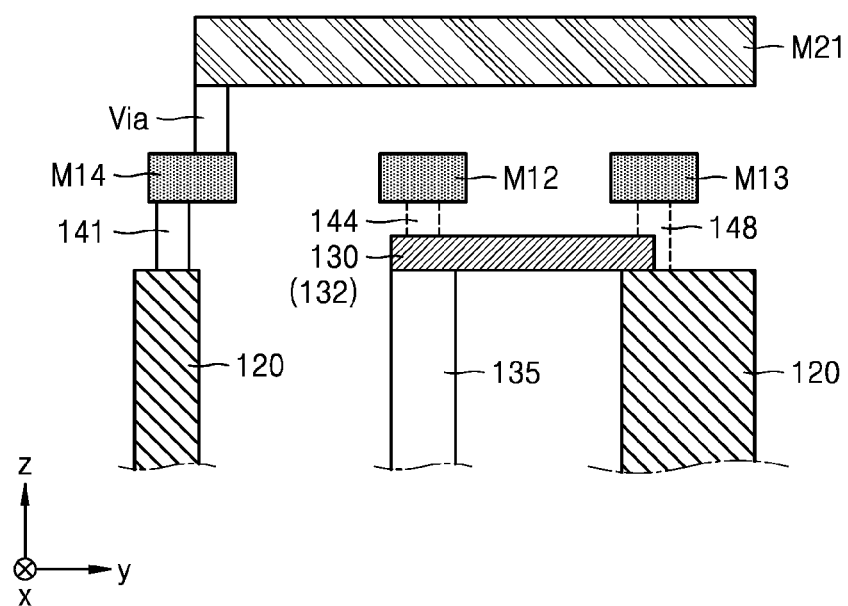

The first node 132 may be lower than the first metal layer M1 and the second metal layer M2 (see, FIG. 9E). Therefore, a top surface of the first node 132 may be lower than top surfaces of the contacts connected to the first metal layer M1 and the second metal layer M2. For example, the first node 132 may be arranged to be lower than the first metal layer M1 and the second metal layer M2 so that connection between the contacts and the first metal layer M1 and the second metal layer M2 may not be affected. As shown in FIG. 9E, the contact 144 may connect the bit line bar M12 to a corresponding underlying element, and the contact 148 may connect the power line M13 to a corresponding underlying element. The node 130 (e.g., the first node 132) connected to the node contact 135 may be disposed below the bit line bar M12 and the power line M13. For example, a top surface of the node 130 may be lower than a bottom surface of each of the bit line bar M12 and the power line M13. The arrangement of the node 130 below the first metal layer M1 may not affect the arrangements of the contacts 141, 144, and 148, for example.

In some embodiments, a structure in which the second gate 124 is connected to the second fin active region 110-2 through the second node 134 may be obtained by rotating the structure of FIG. 4A 180 degrees or may correspond to point symmetry of the structure of FIG. 4A. Therefore, the first fin active region 110-1 and the second fin active region 110-2 may have the same structure. For example, the first region 1st AR of the first fin active region 110-1 and the third region 3rd AR of the second fin active region 110-2 may have the same structure. The second region 2nd AR of the first fin active region 110-1 and the fourth region 4th AR of the second fin active region 110-2 may have the same structure as each other.

Referring to FIG. 4D, in the connection structure between the fourth gate 128 and the first fin active region 110-1 through the first node 132, the node contact 135 may pass through the first upper layer 114-1 and the isolation insulating layer 150 to be connected to the first lower layer 112-1 and the first upper layer 114-1. The first upper layer 114-1 may further extend from the node contact 135 to the left.

Figure 5A:
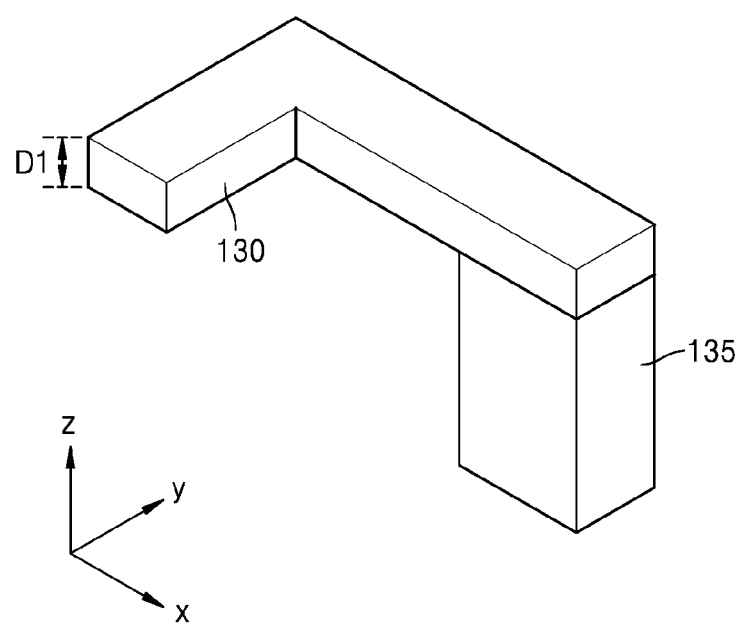
FIGS. 5A to 5C are perspective views illustrating three structures of nodes in the SRAM device of FIG. 2.
Figure 5B:
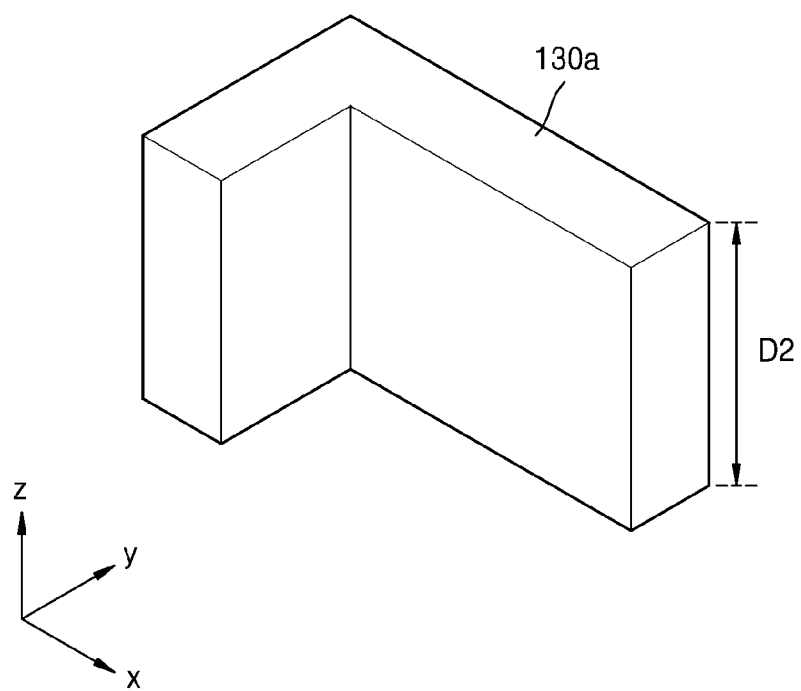
Figure 5C:
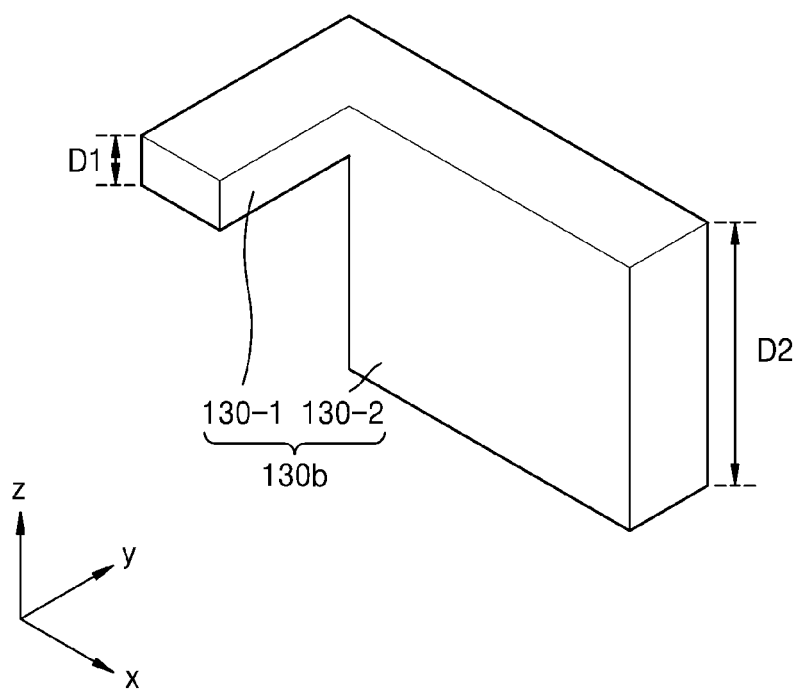

FIGS. 5A to 5C are perspective views illustrating three structures of nodes in the SRAM device of FIG. 2.

Referring to FIG. 5A, in the SRAM device 100 according to some embodiments, the node 130 may be 'L'-shaped on a plane and may have a first thickness D1. In some embodiments, the node 130 may have a uniform thickness of the first thickness D1. The node 130 having such a structure may be arranged on a top surface of each of the four gates 120 and a top surface of the node contact 135 and may connect the four gates 120 to the node contact 135. For example, as shown in FIG. 4A, a bottom surface of the node 132 may contact the top surfaces of the fourth gate 128 and the top surface of the node contact 135.

Referring to FIG. 5B, in the SRAM device 100 according to some embodiments, node 130a may be 'L'-shaped on a plane and may have a second thickness D2. In some embodiments, the node 130a may have a uniform thickness of the second thickness D2. The second thickness D2 may be greater than the first thickness D1 and may be equal to the sum of the first thickness D1 and a thickness of the node contact 135. The node contact 135 as shown in FIG. 5A may be omitted. The node 130a may be connected to a side of a corresponding gate of the four gates 120 or may be connected to a corresponding gate of the four gates 120 in the form of passing through the corresponding gate. For example, when the node 130a is applied to FIG. 4A, the node 130a may be connected to a side of the gate 128 or may be connected to the gate 128 in the form of passing through the gate 128. In some embodiments, the nodes 130a may be connected to sides of the first and second upper layers 114-1 and 114-2. In some embodiments, the nodes 130a may be connected to the first and second upper layers 114-1 and 114-2 in the form of passing through the first and second upper layers 114-1 and 114-2 and may be connected to the first and second lower layers 112-1 and 112-2 through the isolation insulating layer 150.

Referring to FIG. 5C, in the SRAM device 100 according to some embodiments, node 130b may be 'L'-shaped on a plane and may include a first node 130-1 having the first thickness D1 and a second node 130-2 having the second thickness D2. The second thickness D2 may be equal to the sum of the first thickness D1 and the thickness of the node contact 135. The node contact 135 may be omitted. In some embodiments, the nodes 130b may be connected to top surfaces of the four gates 120 through the first node 130-1. In some embodiments, the nodes 130b may be connected to sides of the first and second upper layers 114-1 and 114-2 through the second node 130-2 or may be connected to the first and second upper layers 114-1 and 114-2 in the form of passing through the first and second upper layers 114-1 and 114-2 and may be connected to the first and second lower layers 112-1 and 112-2 through the isolation insulating layer 150.

Figure 6:
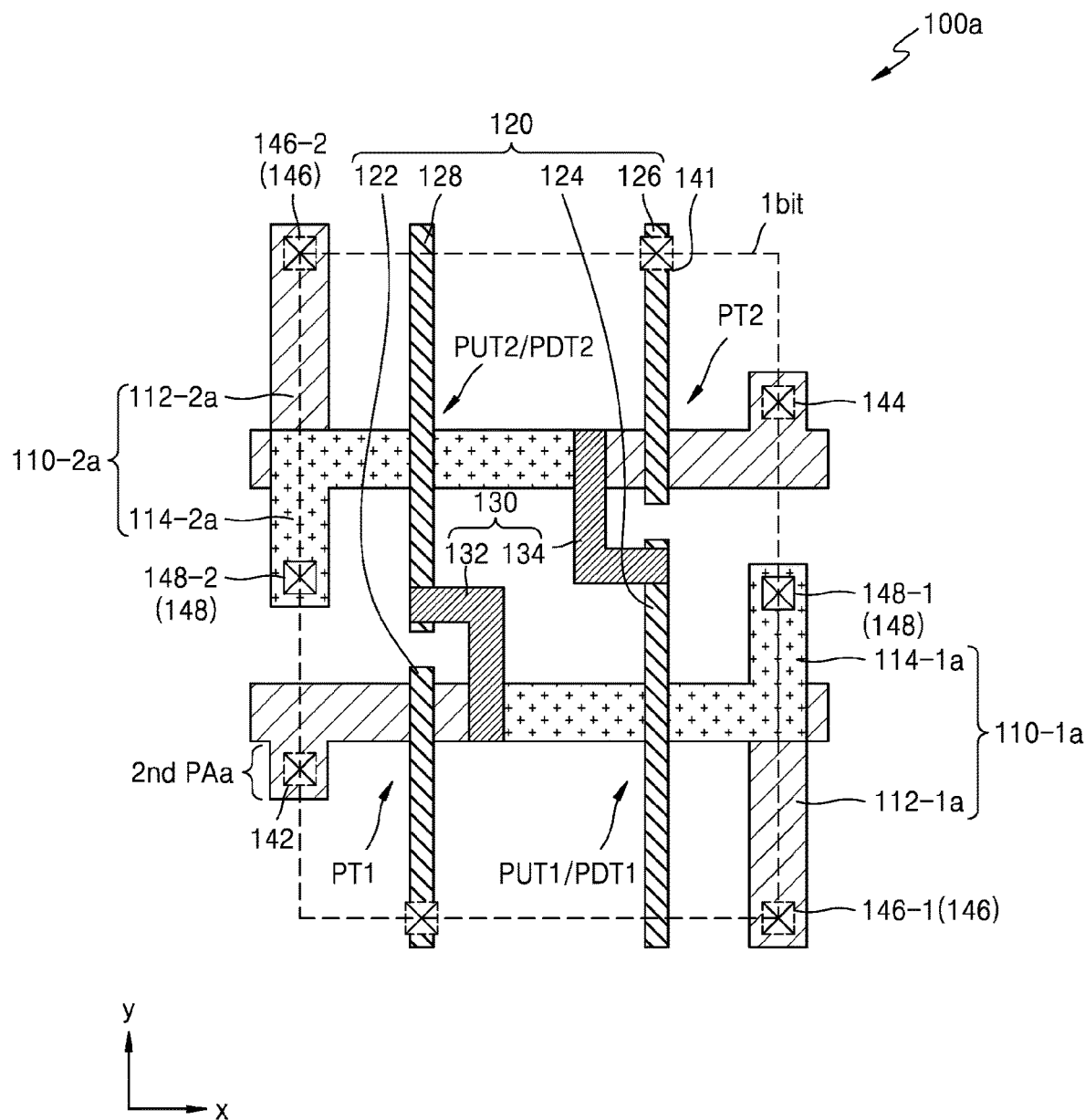
FIG. 6 is a layout diagram illustrating an SRAM device according to an embodiment of the inventive concept.

FIG. 6 is a layout diagram illustrating an SRAM device 100a according to an embodiment of the inventive concept. Description previously given with reference to FIGS. 1 to 5C will be simply given or will be omitted.

Referring to FIG. 6, the SRAM device 100a according to some embodiments may be different from the SRAM device 100 of FIG. 2 in that a first lower layer 112-1a of a first fin active region 110-1a further includes a second portion 2nd PAa. For example, in the SRAM device 100a according to some embodiments, the first lower layer 112-1a of the first fin active region 110-1a may further include the second portion 2nd PAa extending from the left end in the first direction (the x direction) downward in the second direction (the y direction). The bit line contact 142 may be arranged in the second portion 2nd PAa. A portion extending upward from the second portion 2nd PA of the first lower layer 112-1a and a fourth portion 4th PA of a first upper layer 114-1a may be shorter than the portion extending upward from the second portion 2nd PA of the first lower layer 112-1 and the fourth portion 4th PA of the first upper layer 114-1 in the SRAM device 100 of FIG. 2. A structure of a second fin active region 110-2a may be obtained by rotating the structure of the first fin active region 110-1a 180 degrees or may correspond to point symmetry of the structure of the first fin active region 110-1a.

In the SARM device 100a according to some embodiments, a distance between the first fin active region 110-1a and the second fin active region 110-2a may be reduced in the second direction (the y direction). Therefore, a size of a one-bit unit cell of the SARM device 100a may be reduced so that a size of the SARM device 100a may be reduced. Furthermore, in FIG. 6, a dot-lined rectangular portion may correspond to the one-bit unit cell of the SARM device 100a.

Figure 7A:
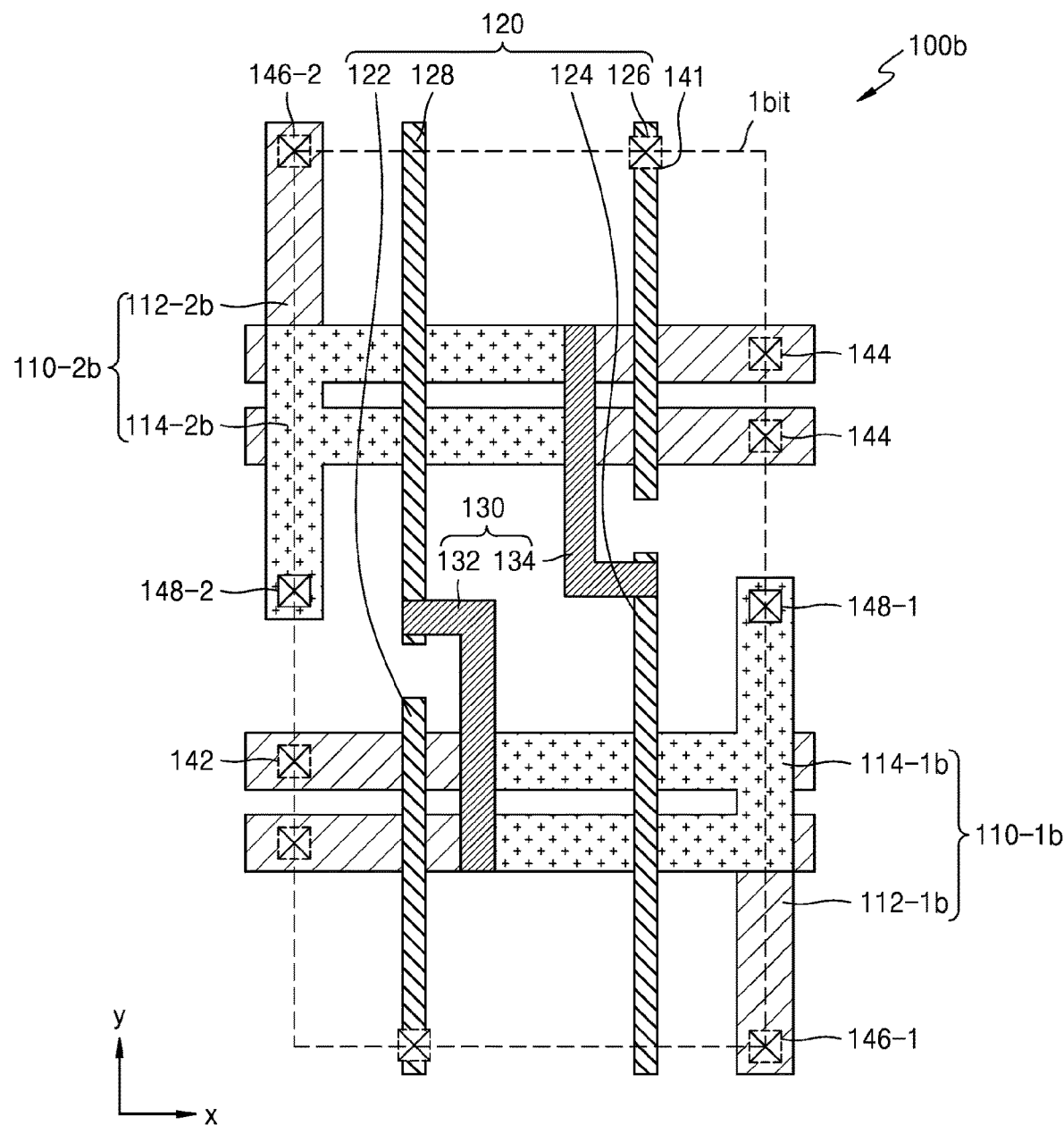
FIGS. 7A to 7F are layout diagrams illustrating SRAM devices each including a 3DS FET according to an embodiment of the inventive concept and perspective views and cross-sectional views illustrating main portions of SRAM devices each including a 3DS FET according to an embodiment of the inventive concept.
Figure 7B:
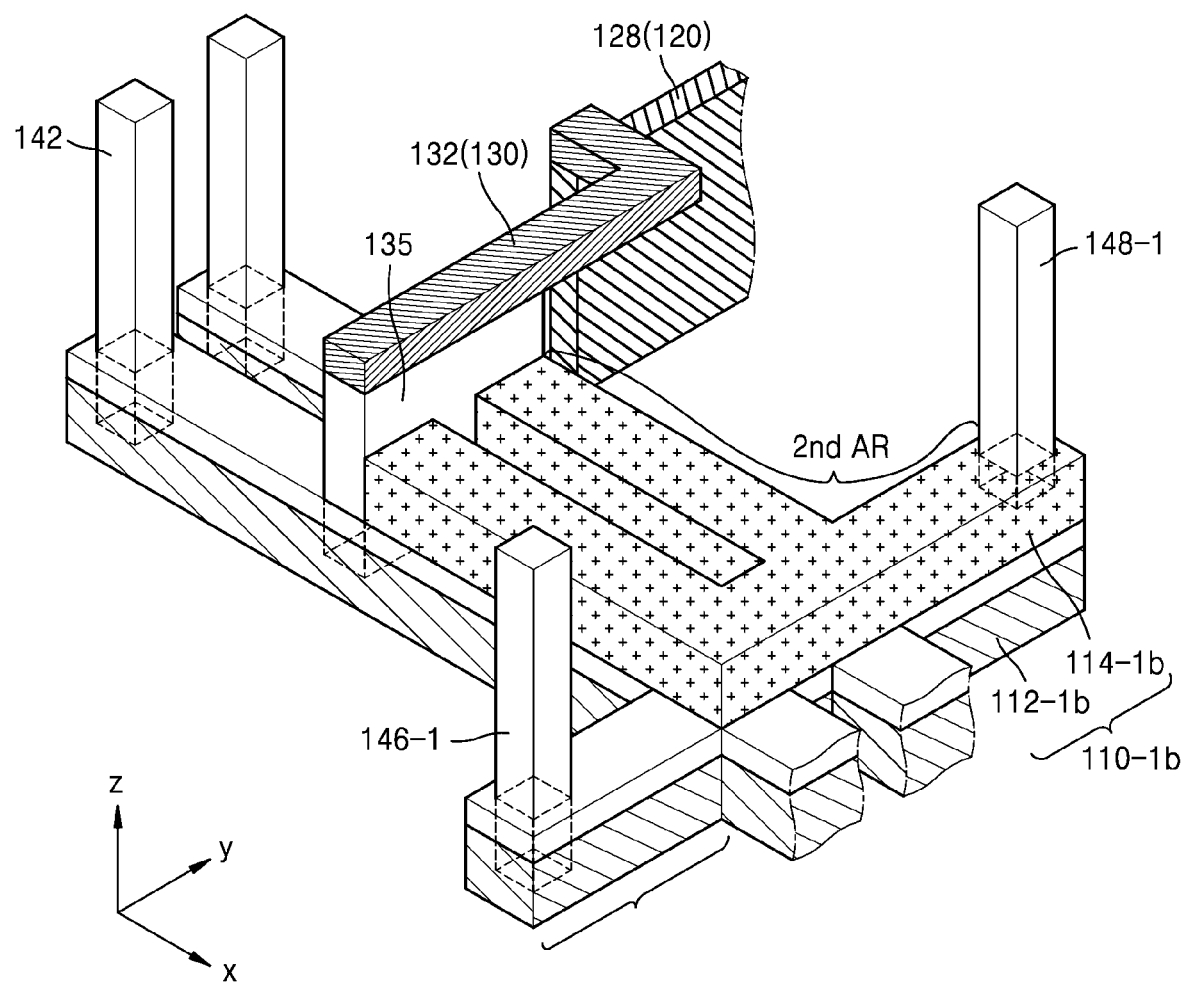
Figure 7C:
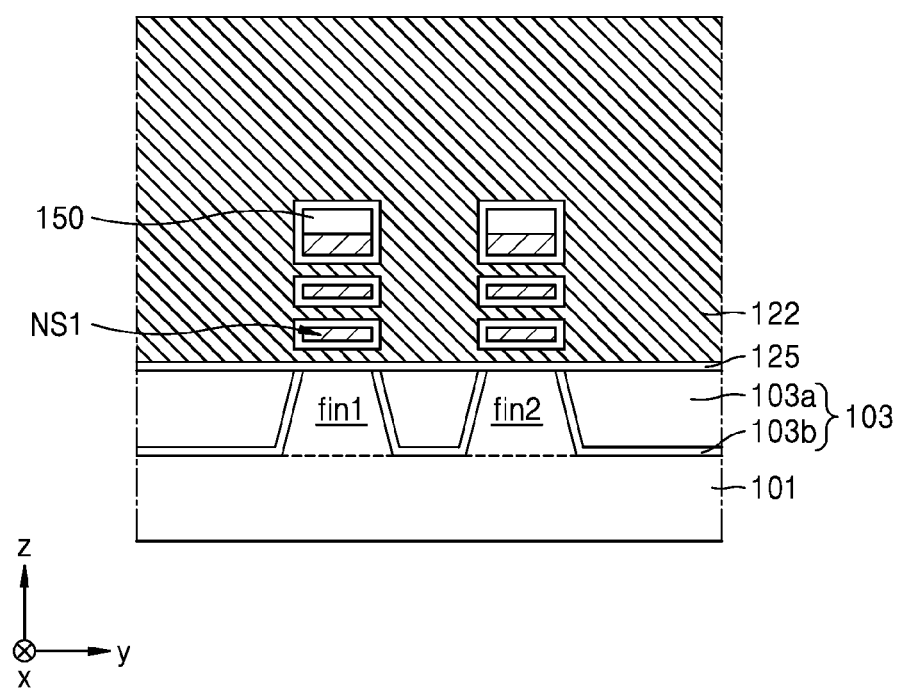
Figure 7D:
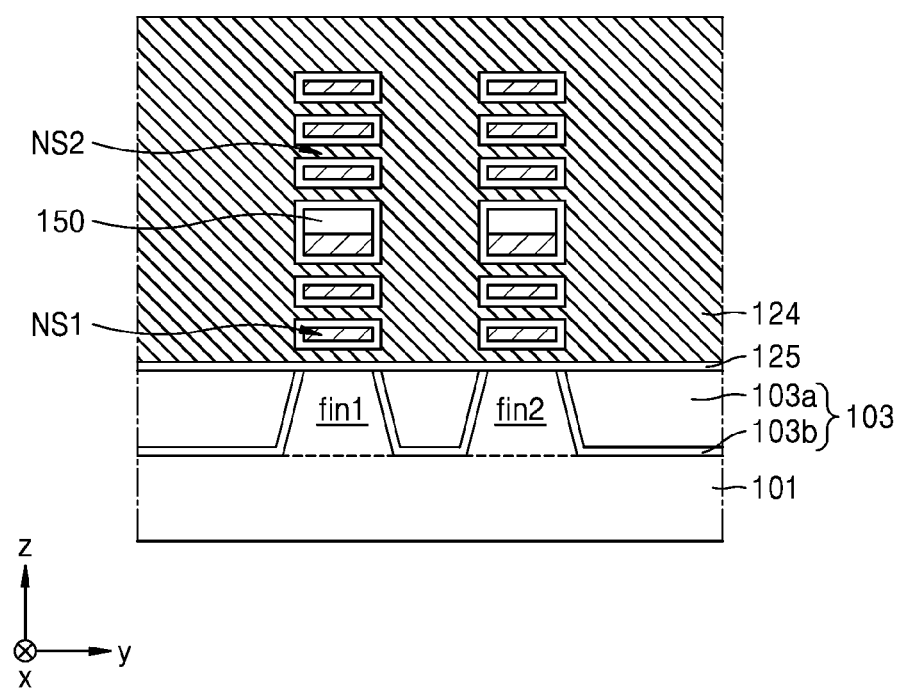
Figure 7E:
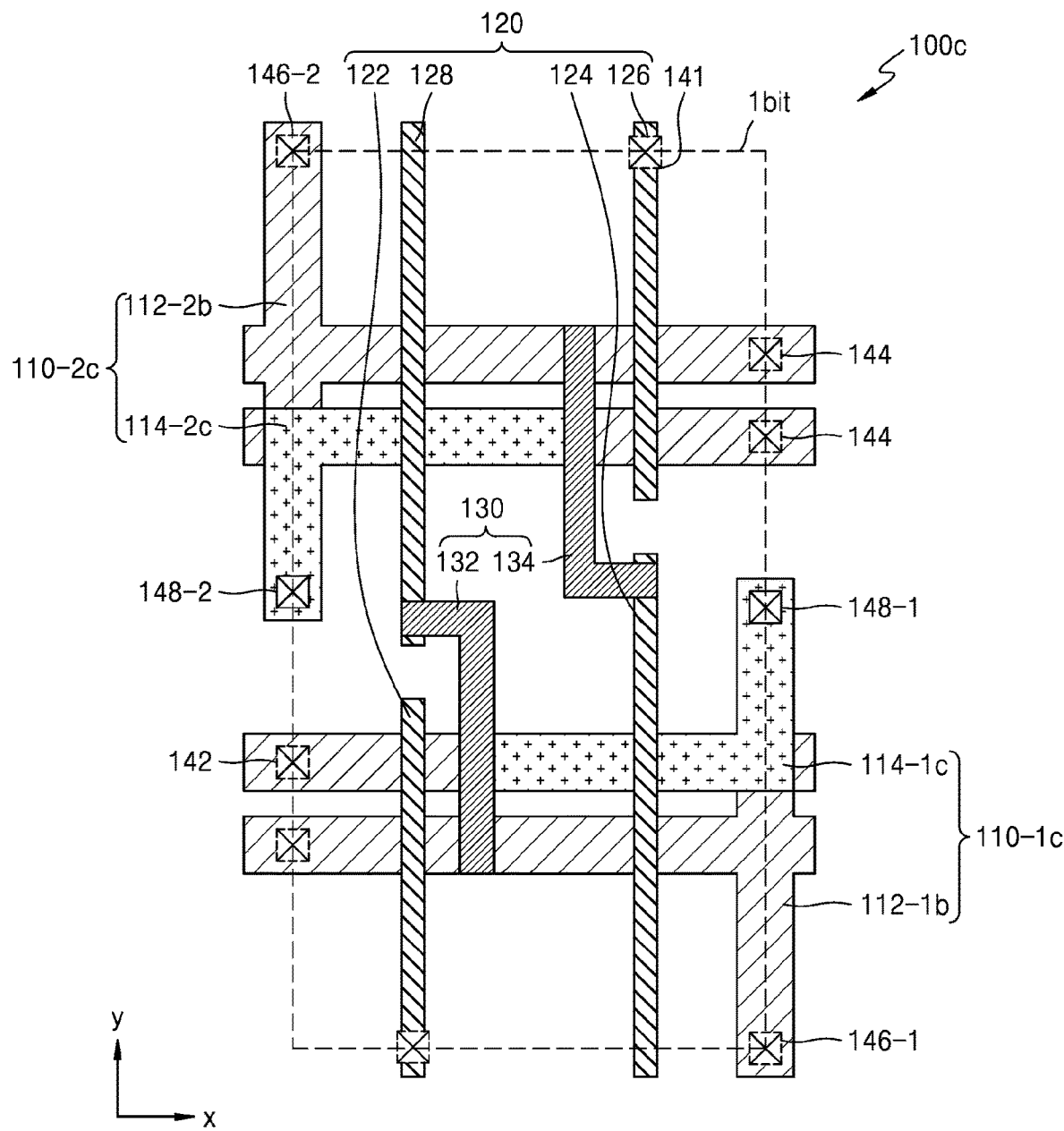
Figure 7F:
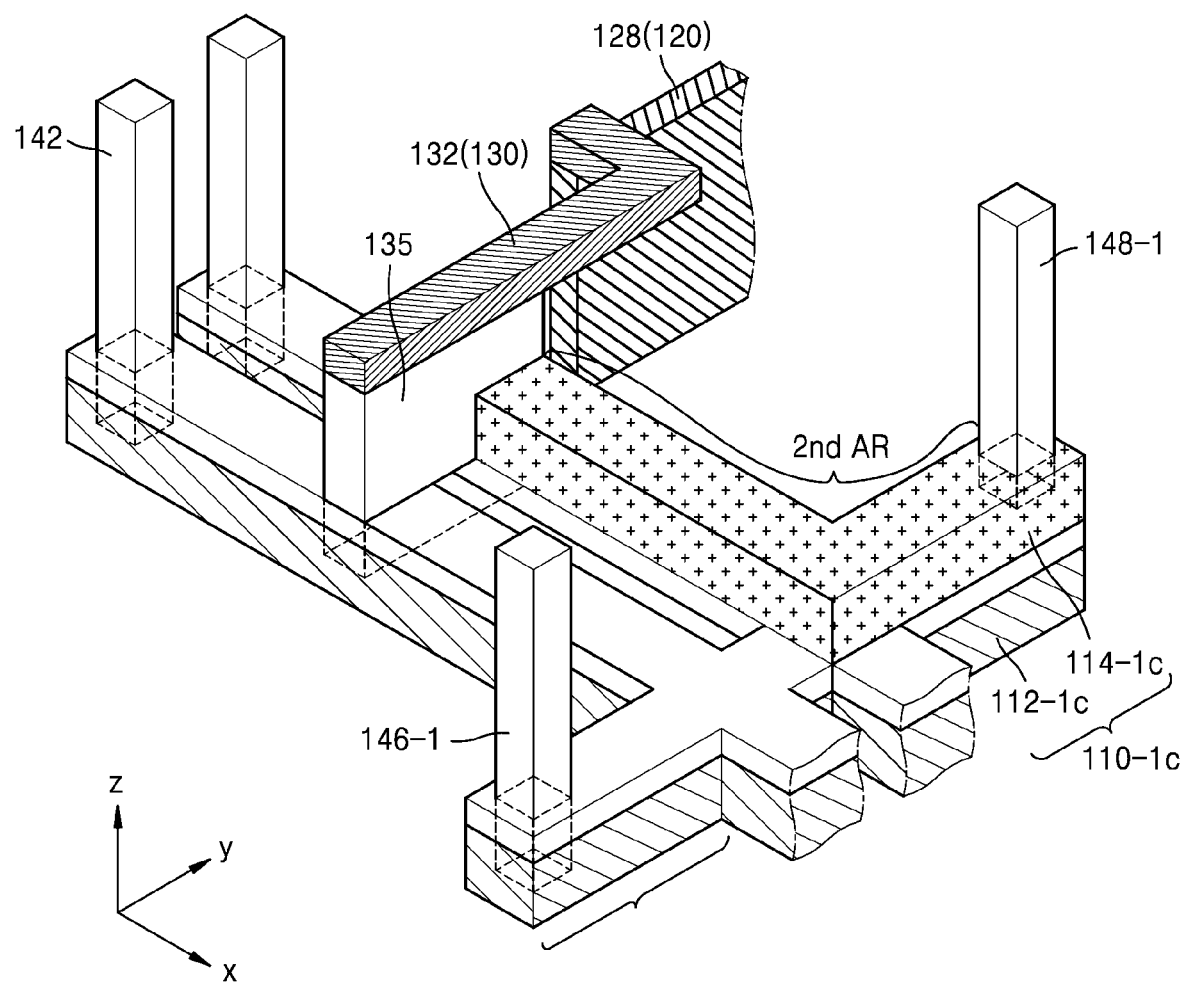

FIGS. 7A to 7F are layout diagrams illustrating SRAM devices 100b and 100c according to an embodiment of the inventive concept and perspective views and cross-sectional views illustrating main portions of SRAM devices 100b, and 100c according to an embodiment of the inventive concept. FIG. 7B is a perspective view illustrating main portions of the SRAM device of FIG. 7A and FIGS. 7C and 7D are cross-sectional views corresponding to FIGS. 3B and 3C. FIG. 7E is a layout diagram illustrating a structure in which an upper layer includes one nano-sheet and FIG. 7F is a perspective view illustrating main portions of the SRAM device of FIG. 7E. Description previously given with reference to FIGS. 1 to 5C will be simply given or will be omitted.

Referring to FIGS. 7A to 7D, the SRAM device 100b according to some embodiments may be different from the SRAM device 100 of FIG. 2 in that first and second fin active regions 110-1b and 110-2b each includes first and second fins fin1 and fin2. Due to a point symmetry structure of the first and second fin active regions 110-1b and 110-2b, only the first fin active regions 110-1b will be described below. Specifically, in the SRAM device 100b according to some embodiments, the first fin active region 110-1b may include the first fin fin1 and the second fin2. In addition, the first and second nano-sheets NS1 and NS2 may be arranged on each of the first fin fin1 and the second fin2. For example, in a first lower layer 112-1b of a first region 1st AR of the first fin active region 110-1b, the first nano-sheets NS1 corresponding to each of the first fin fin1 and the second fin2 may be arranged. In addition, in the first lower layer 112-1b of a second region 2nd AR of the first fin active region 110-1b, the first nano-sheets NS1 corresponding to each of the first fin fin1 and the second fin2 may be arranged and, in the first upper layer 114-1b of the second region 2nd AR of the first fin active region 110-1b, the second nano-sheets NS2 corresponding to each of the first fin fin1 and the second fin2 may be arranged.

Two first portions 1st PA of the first lower layer 112-1b of the first fin active region 110-1b may be connected to each other in a second portion 2nd PA of the first lower layer 112-1b of the first fin active region 110-1b. Therefore, one first ground contact 146-1 may be arranged in the second portion 2nd PA of the first lower layer 112-1b, which extends downward. However, the two first portions 1st PA may be apart from each other on the left and the bit line contact 142 may be arranged in each of the two first portions 1st PA. In some embodiments, a connection conductive pattern connecting the two first portions 1st PA to each other may pass through the isolation insulating layer 150 and one bit line contact 142 may be arranged in the connection conductive pattern.

Two third portions 3rd PA of the first upper layer 114-1b of the first fin active region 110-1b may be connected to each other in a fourth portion 4th PA. Therefore, one first power contact 148-1 may be arranged in the fourth portion 4th PA of the first upper layer 114-1b.

The node contact 135 may be connected to sides of the two third portions 3rd PA of the first upper layer 114-1b or may be connected to the first upper layer 114-1b in the form of passing through the first upper layer 114-1b and may be connected to two first portions 1st PA of the first lower layer 112-1b through the isolation insulating layer 150. The first node 132 may connect the node contact 135 to the fourth gate 128.

In some embodiments, structures of the second fin active region 110-2b, the second node 134 connecting the second fin active region 110-2b to the second gate 124, and the node contact 135 may be obtained by rotating the structures of the first fin active region 110-1b, the second node 134 connecting the first fin active region 110-1b to the fourth gate 128, and the node contact 135 180 degrees or may correspond to point symmetry of the structures of the first fin active region 110-1b, the second node 134 connecting the first fin active region 110-1b to the fourth gate 128, and the node contact 135. Furthermore, in FIG. 7A, a dot-lined rectangular portion may correspond to the one-bit unit cell of the SARM device 100b.

Referring to FIGS. 7E and 7F, the SRAM device 100c according to some embodiments may be different from the SRAM device 100b of FIG. 7A in that first and second upper layers 114-1c and 114-2c each includes only nano-sheets corresponding to one fin, for example, a second fin fin2. Due to a point symmetry structure of first and second fin active regions 110-1c and 110-2c, only the first fin active regions 110-1c will be described below. Specifically, in the SRAM device 100c according to some embodiments, the first fin active region 110-1c may include the first fin fin1 and the second fin2. In addition, the first fin active region 110-1c may include two first portions 1st PA respectively corresponding to the first fin fin1 and the second fin2 in a first lower layer 112-1c and only one third portion 3rd PA corresponding to the second fin fin2 may be included in a first upper layer 114-1c. Therefore, first nano-sheets NS1 corresponding to each of the first fin fin1 and the second fin2 may be arranged in the first lower layer 112-1c of a first region 1st AR of the first fin active region 110-1c. In addition, first nano-sheets NS1 corresponding to each of the first fin fin1 and the second fin2 may be arranged in the first lower layer 112-1c of a second region 2nd AR of the first fin active region 110-1c and second nano-sheets NS2 corresponding to the second fin2 may be arranged in the first upper layer 114-1c of the second region 2nd AR of the first fin active region 110-1c.

In some embodiments, structures of a second fin active region 110-2c, the second node 134 connecting the second fin active region 110-2c to the second gate 124, and the node contact 135 may be obtained by rotating the structures of the first fin active region 110-1c, the second node 134 connecting the first fin active region 110-1c to the fourth gate 128, and the node contact 135 180 degrees or may correspond to point symmetry of the structures of the first fin active region 110-1c, the second node 134 connecting the first fin active region 110-1c to the fourth gate 128, and the node contact 135. Furthermore, in FIG. 7E, a dot-lined rectangular portion may correspond to the one-bit unit cell of the SARM device 100c.

Figure 8A:
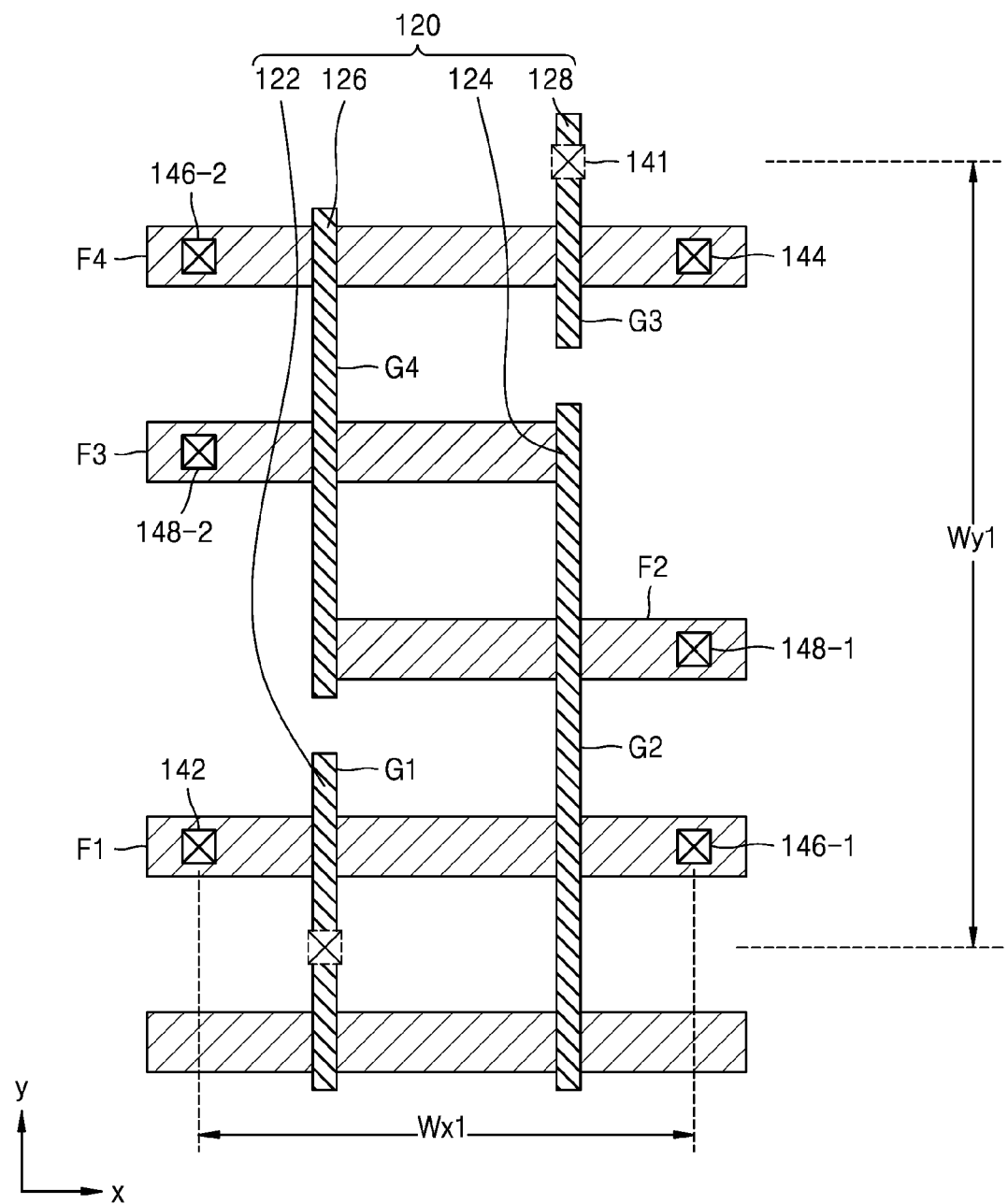
FIGS. 8A and 8B are layout diagrams illustrating an SRAM device according to a comparative example in which a size of the SRAM device according to the comparative example is compared with that of the SRAM device of FIG. 2, and illustrating the SRAM device of FIG. 2.
Figure 8B:
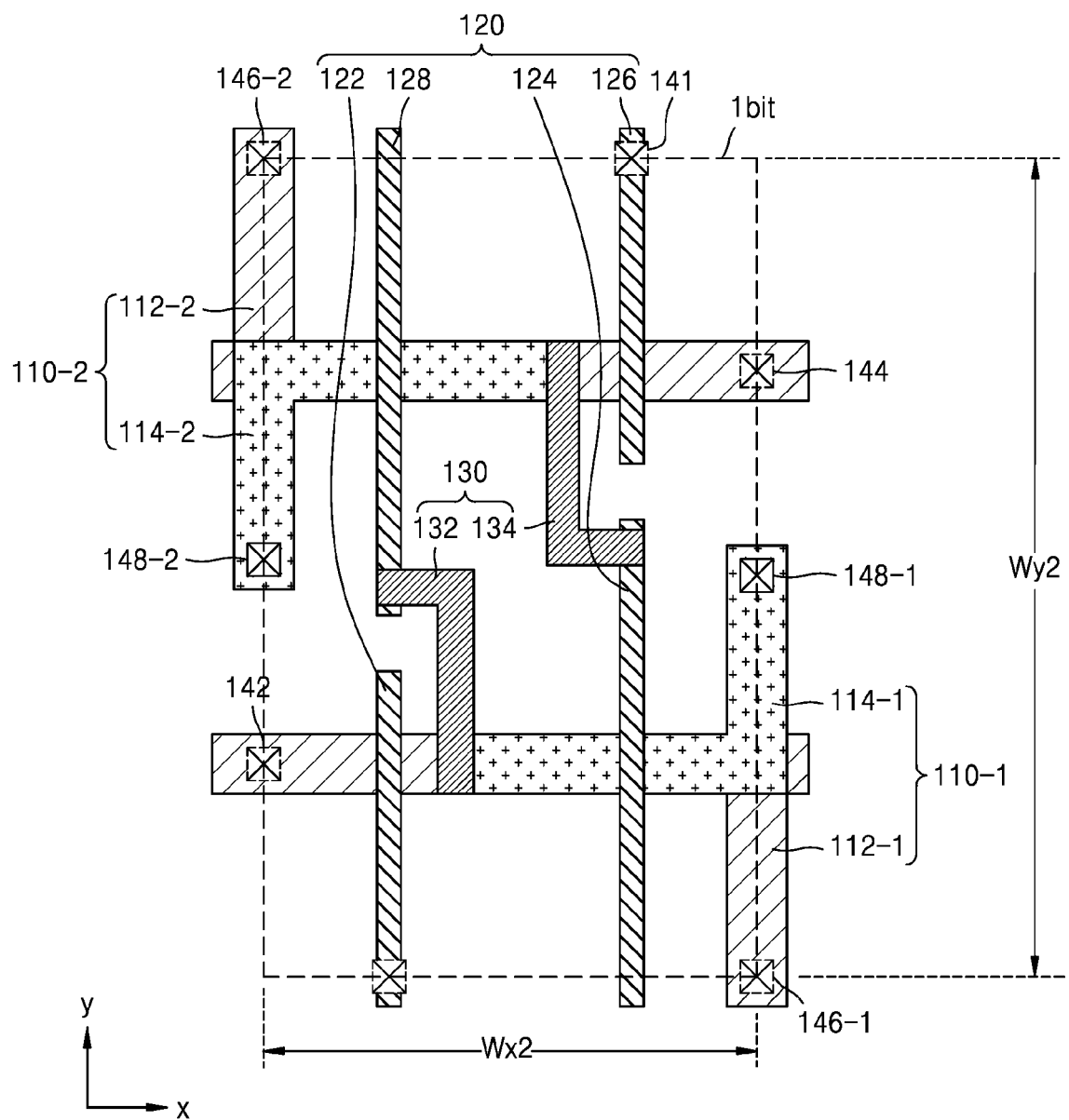

FIGS. 8A and 8B are layout diagrams illustrating an SRAM device according to a comparative example in which a size of the SRAM device according to the comparative example is compared with that of the SRAM device of FIG. 2 and illustrating the SRAM device of FIG. 2.

FIG. 8A illustrates a layout of the SRAM device according to the comparative example. The SRAM device according to the comparative example may include first to fourth fin active regions. Specifically, a one-bit unit cell of the SRAM device according to the comparative example includes the first to fourth fin active regions F1 to F4 from a bottom and each of the first to fourth fin active regions F1 to F4 may have a single layered structure. Therefore, the first fin active region F1 of the SRAM device according to the comparative example may correspond to the first lower layer 112-1 of the first fin active region 110-1 of the SRAM device of FIG. 2, the second fin active region F2 of the SRAM device according to the comparative example may correspond to the first upper layer 114-1 of the first fin active region 110-1 of the SRAM device of FIG. 2, the third fin active region F3 of the SRAM device according to the comparative example may correspond to the second upper layer 114-2 of the second fin active region 110-2 of the SRAM device of FIG. 2, and the fourth fin active region F4 of the SRAM device according to the comparative example may correspond to the second lower layer 112-2 of the second fin active region 110-2 of the SRAM device of FIG. 2.

In some embodiments, a first gate G1 intersects the first fin active region F1 and extends in the second direction (the y direction). A second gate G2 intersects the first fin active region F1 and the second fin active region F2, extends in the second direction (the y direction), and may be connected to the third fin active region F3. A third gate G3 intersects the fourth fin active region F4 and extends in the second direction (the y direction). A fourth gate G4 intersects the third fin active region F3 and the fourth fin active region F4, extends in the second direction (the y direction), and may be connected to the second fin active region F2.

In addition, the bit line contact 142 and the first ground contact 146-1 may be arranged in the first fin active region F1 of the SRAM device according to the comparative example, the first power contact 148-1 may be arranged in the second fin active region F2 of the SRAM device according to the comparative example, the second power contact 148-2 may be arranged in the third fin active region F3 of the SRAM device according to the comparative example, and the bit line bar contact 144 and the second ground contact 146-2 may be arranged in the fourth fin active region F4 of the SRAM device according to the comparative example.

In the SRAM device according to the comparative example, because the one-bit unit cell includes the first to fourth fin active regions F1 to F4, a length of the SRAM device in the second direction (the y direction) may be large. In the SRAM device according to some embodiments, because the one-bit unit cell includes the only two fin active regions 110-1 and 110-2, a length of the SRAM device in the second direction (the y direction) may be small.

When a width of the one-bit unit cell of the SRAM device according to the comparative example in the first direction (the x direction) is referred to as a first width Wx1 and a length of the one-bit unit cell of the SRAM device according to the comparative example in the second direction (the y direction) is referred to as a first length Wy1, the first length Wy1 may be twice the first width Wx1. In some embodiments, a width, in the first direction (the x direction), of the one-bit unit cell of the SRAM device 100 according to some embodiments is referred to as a second width Wx2, and a length, in the second direction (the y direction), of the one-bit unit cell of the SRAM device according to some embodiments is referred to as a second length Wy2. The second length Wy2 may be 1.6 times the second width Wx2. Therefore, when it is assumed that the first width Wx1 is equal to the second width Wx2, because 1.6/2=0.8, the size of the one-bit unit cell of the SRAM device 100 according to some embodiments may be a reduction of about 20% of the one-bit unit cell of the SRAM device according to the comparative example.

FIGS. 9A to 9E are layout diagrams and cross-sectional views illustrating an enlargement of the SRAM device of FIG. 2 to a 4-bit SRAM device. FIG. 9A is a layout diagram illustrating an enlargement of the SRAM device of FIG. 2 to a 4-bit SRAM device, FIG. 9B is a layout diagram illustrating an SRAM device obtained by adding a first metal layer to the SRAM device of FIG. 9A, FIG. 9C is a layout diagram illustrating an SRAM device obtained by adding a second metal layer to the SRAM device of FIG. 9A, FIG. 9D is a layout diagram illustrating an SRAM device obtained by adding a first metal layer and a second metal layer to the SRAM device of FIG. 9A, and FIG. 9E is a cross-sectional view taken along the line V-V' of FIG. 9D. Description previously given with reference to FIGS. 1 to 8B will be simply given or will not be given.

Referring to FIG. 9A, a 4-bit cell may include four one-bit unit cell of FIG. 2 in a two-dimensional array structure. The 4-bit cell of FIG. 9A is divided into four quadrants by using an x axis and a y axis as orthogonal axes, and in the first quadrant Q1, a shape of the one-bit unit cell may correspond to the one-bit unit cell of FIG. 2. In the second quadrant Q2, the one-bit unit cell may have a y axis symmetrical structure of the one-bit unit cell of FIG. 2. In the fourth quadrant Q4, the one-bit unit cell may have an x axis symmetrical structure of the one-bit unit cell of FIG. 2. In the third quadrant Q3, the one-bit unit cell may have a point symmetrical structure of the one-bit unit cell of FIG. 2. In FIG. 9A, each of the quadrants is marked with a rectangular solid line.

In the 4-bit cell of FIG. 9A, in the second direction (the y direction), the first and second fin active regions 110-1 and 110-2 of FIG. 2 may be repeatedly arranged such that two neighboring first fin active regions 110-1 are arranged and then, two neighboring second fin active regions 110-2 are arranged. In some embodiments, in the first and second fin active regions 110-1 and 110-2, the first portions 1st PA of the first and second lower layers 112-1 and 112-2 may continuously extend in the first direction (the x direction).

In the first fin active region 110-1, the first upper layer 114-1 is arranged such that the first region 1st AR and the second region 2nd AR are alternately repeated in the first direction (the x direction) and, in the second fin active region 110-2, the second upper layer 114-2 is arranged such that the third region 3rd AR and the fourth region 4th AR are alternately repeated in the first direction (the x direction). In the first direction (the x direction), a position of the first region 1st AR of the first fin active region 110-1 may correspond to a position of the fourth region 4th AR of the second fin active region 110-2 and a position of the second region 2nd AR of the first fin active region 110-1 may correspond to a position of the third region 3rd AR of the second fin active region 110-2. For example, the first region 1st AR of the first fin active region 110-1 and the fourth region 4th AR of the second fin active region 110-2 may overlap in the first direction (the x direction), and the second region 2nd AR of the first fin active region 110-1 and the third region 3rd AR of the second fin active region 110-2 may overlap in the first direction (the x direction).

The second portion 2nd PA of a first lower layer 112-1 of one of two adjacent two first fin active regions 110-1 may be connected to the second portion 2nd PA of the first lower layer 112-1 of the other of the two adjacent two first fin active regions 110-1. The one of the two adjacent two first fin active regions 110-1 may neighbor the other of the two adjacent two first fin active regions 110-1 in the second direction (the y direction). The second portion 2nd PA of the second lower layer 112-2 of two adjacent second fin active region 110-2 may be connected to the second portion 2nd PA of the second lower layer 112-2 of the second fin active region 110-2, which neighbors in the second direction (the y direction). Therefore, based on the positions of the first to fourth regions 1st AR to 4th AR, in the first direction (the x direction), the second portion 2nd PA of the first lower layer 112-1 of the first fin active region 110-1 may be arranged in zigzags together with the second portion 2nd PA of the second lower layer 112-2 of the second fin active region 110-2. The first upper layer 114-1 of the first fin active region 110-1 and the second upper layer 114-2 of the second fin active region 110-2 may be arranged in zigzags in the first direction (the x direction). For example, a plurality of horizontal fin active regions may extend in the first direction (the x direction) and may be spaced apart from one another in the second direction (the y direction) perpendicular to the first direction, and a plurality of vertical fin active regions may extend in the second direction and may be spaced apart from one another in the first direction (the x direction). Each of the plurality of vertical fin active regions may intersect two neighboring horizontal fin active regions among the plurality of horizontal fin active regions. The plurality of first vertical fin active regions may include a first row of first vertical fin active regions that are arranged along a first straight line extending in the first direction, and a second row of first vertical fin active regions that are arranged along a second straight line extending in the first direction. First vertical fin active regions in the first and second rows may be arranged in zigzags in the first direction.

In the 4-bit cell structure, in the four gates 120, the first and third gates 122 and 126 may extend in the second direction (the y direction) to intersect the first region 1st AR of each of the two neighboring first fin active regions 110-1. In FIG. 9A, the two short gates (i.e., a pair of inner gates) in the center may correspond to the first and third gates 122 and 126. The second and fourth gates 124 and 128 may extend in second direction (the y direction) to intersect the two neighboring first fin active regions 110-1. In FIG. 9A, the two long gates (i.e., a pair of outer gates) in the outside may correspond to the second and fourth gates 124 and 128. The four gates 120 may be arranged between the two second portions 2nd PA of the first lower layers 112-1 neighboring in the first direction (the x direction), the first and third gates 122 and 126 among the four gates 120 may be arranged in the center, and the second and fourth gates 124 and 128 may be arranged in the outside.

Referring to FIG. 9B, the first metal layer M1 may be arranged on the four gates 120. The first metal layer M1 may include the bit line M11, the bit line bar M12, the power line M13, and a bar-type metal M14. The bit line M11, the bit line bar M12, and the power line M13 may continuously extend to the outside of the cell region in the first direction (the x direction).

As described above, the bit line M11 may be connected to the bit line contact 142, the bit line bar M12 may be connected to the bit line bar contact 144, and the power line M13 may be connected to the power contact 148. The bar-type metal M14 may be rectangular to be longitudinal in the first direction (the x direction) and may be connected to the gate contact 141 and the ground contact 146. The bar-type metal M14 may be used for connection to the second metal layer M2.

Referring to FIGS. 9C to 9E, the second metal layer M2 may be arranged on the first metal layer M1. The second metal layer M2 may include a word line M21 and a ground line M22. The word line M21 and the ground line M22 may continuously extend to the outside of the cell region in the second direction (the y direction).

As described above, the word line M21 may be connected to the gate contact 141 and the ground line M22 may be connected to the ground contacts 146. The word line M21 and the ground line M22 may not be directly connected to the gate contact 141 and the ground contacts 146, respectively, and may be connected to the gate contact 141 and the ground contacts 146 through the bar-type metal M14 and a via. For reference, in FIG. 9D, the via may be arranged in a portion in which the second metal layer M2 and the bar-type metal M14 overlap each other.

FIG. 9E illustrates heights of the four gates 120, the nodes 130, the gate contact 141, the bit line bar contact 144, the power contacts 148, the first metal layers M11, M13, and M14, and the second metal layer M21.

While the inventive concept has been particularly shown and described with reference to embodiments thereof, it will be understood that various changes in form and details may be made therein without departing from the spirit and scope of the following claims.

What is claimed is:

1. A static random-access memory (SRAM) device including a three-dimensional structured (3DS) field-effect transistor (FET), the SRAM device comprising:
    a semiconductor substrate;
    a first fin active region extending on the semiconductor substrate in a first direction and including a first region and a second region, wherein in the first region and the second region, a first lower layer is arranged, wherein only in the second region, a first upper layer is arranged on the first lower layer, and wherein the second region is to the right of the first region;
    a second fin active region extending on the semiconductor substrate in the first direction and including a third region and a fourth region, wherein in the third region and the fourth region, a second lower layer is arranged, wherein only in the fourth region, a second upper layer is arranged on the second lower layer, wherein the fourth region is to the left of the third region, and wherein the second fin active region is spaced apart from the first fin active region in a second direction perpendicular to the first direction;
    a first gate electrode extending along a first straight line extending in the second direction and intersecting the first region;
    a second gate electrode extending along a second straight line extending in the second direction and intersecting the second region, wherein the first gate electrode and the second gate electrode are spaced apart from each other in the first direction;
    a third gate electrode extending along the second straight line extending in the second direction and being separate from the second gate electrode in the second direction, and intersecting the third region;
    a fourth gate electrode extending along the first straight line extending in the second direction and being separate from the first gate electrode in the second direction, and intersecting the fourth region, wherein the third gate electrode and the fourth gate electrode are spaced apart from each other in the first direction;
    a first node connecting the fourth gate electrode to the second region of the first fin active region; and
    a second node connecting the second gate electrode to the fourth region of the second fin active region, wherein the first node includes a first portion connected to the fourth gate electrode and a second portion connected to the second region of the first fin active region,
wherein the second portion of the first node is buried in the first lower layer of the first fin active region and contacts a side surface of the first upper layer of the second region of the first fin active region,
wherein the first gate electrode and the first lower layer of the first region constitute a first pass transistor,
wherein the second gate electrode and the first lower layer of the second region constitute a first pull-down transistor,
wherein the second gate electrode and the first upper layer of the second region constitute a first pull-up transistor,
wherein the third gate electrode and the second lower layer of the third region constitute a second pass transistor,
wherein the fourth gate electrode and the second lower layer of the fourth region constitute a second pull-down transistor, and
wherein the fourth gate electrode and the second upper layer of the fourth region constitute a second pull-up transistor.

2. The SRAM device of claim 1,
wherein the first lower layer of the first region comprises a plurality of nano-sheets intersecting the first gate electrode,
wherein the second lower layer of the third region comprises a plurality of nano-sheets intersecting the third gate electrode,
wherein the first lower layer of the second region comprises a plurality of nano-sheets intersecting the second gate electrode,
wherein the first upper layer of the second region comprises a plurality of nano-sheets intersecting the second gate electrode,
wherein the second lower layer of the fourth region comprises a plurality of nano-sheets intersecting the fourth gate electrode, and
wherein the second upper layer of the fourth region comprises a plurality of nano-sheets intersecting the fourth gate electrode.

3. The SRAM device of claim 2,
wherein the first gate electrode surrounds each of the plurality of nano-sheets of the first lower layer in the first region in a gate-all-round (GAA) structure,
wherein the third gate electrode surrounds each of the plurality of nano-sheets of the second lower layer in the third region in a GAA structure,
wherein the second gate electrode surrounds each of the plurality of nano-sheets of the first lower layer in the second region in a GAA structure,
wherein the second gate electrode surrounds each of the plurality of nano-sheets of the first upper layer in the second region in a GAA structure,
wherein the fourth gate electrode surrounds each of the plurality of nano-sheets of the second lower layer in the fourth region in a GAA structure, and
wherein the fourth gate electrode surrounds each of the plurality of nano-sheets of the second upper layer in the fourth region in a GAA structure.

4. The SRAM device of claim 1,
wherein the first lower layer and the second lower layer are n-type semiconductors,
wherein each of the first pull-down transistor and the second pull-down transistor is of an n-type field effect transistor (FET),
wherein the first upper layer and the second upper layer are p-type semiconductors,
wherein each of the first pull-up transistor and the second pull-up transistor is of a p-type FET,
wherein the first pull-up transistor and the first pull-down transistor constitute a first complementary FET, and
wherein the second pull-up transistor and the second pull-down transistor constitute a second complementary FET.

5. The SRAM device of claim 1, further comprising:
a first contact connecting a portion of the first lower layer on the left of the first gate electrode to a bit line; and
a second contact connecting a portion of the second lower layer on the right of the third gate electrode to a bit line bar.

6. The SRAM device of claim 1,
wherein the first lower layer comprises a first portion extending along a straight line extending in the first direction and a second portion extending along a straight line extending in the second direction,
wherein the second portion of the first lower layer extends from a right end of the first portion upward and downward in the second direction,
wherein the first upper layer comprises a third portion extending along a straight line extending in the first direction and a fourth portion extending along a straight line extending in the second direction,
wherein the fourth portion of the first upper layer extends from a right end of the third portion upward in the second direction, the third portion of the first upper layer being shorter than the first portion of the first lower layer,
wherein in the first region of the first fin active region, the first portion of the first lower layer does not vertically overlap the first upper layer,
wherein in the second region, the first upper layer and the second portion of the first lower layer vertically overlap each other,
wherein when viewed in a plan view, a shape of the second lower layer and a shape of the second upper layer are in a point symmetry with a shape of the first lower layer and a shape of the first upper layer, respectively,
wherein in the third region, a first portion of the second lower layer does not overlap the second upper layer, and
wherein in the fourth region, the second upper layer and a second portion of the second lower layer overlap each other.

7. The SRAM device of claim 6, further comprising:
a first isolation insulating layer in the first fin active region, wherein the first isolation insulating layer is disposed on the first lower layer; and
a second isolation insulating layer in the second fin active region,
wherein the second isolation insulating layer is disposed on the second lower layer, and
wherein the SRAM device further comprises:
a third contact penetrating the first isolation insulating layer to connect a portion of the first lower layer to a ground voltage;
a fourth contact penetrating the second isolation insulating layer to connect a portion of the second lower layer to the ground voltage;
a fifth contact connecting a portion of the first upper layer to a power voltage; and a sixth contact connecting a portion of the second upper layer to the power voltage.

8. The SRAM device of claim 1,
wherein the first node has a shape obtained by rotating 'L' 180 degrees on a plane, and
wherein the second node is 'L'-shaped on a plane.

9. The SRAM device of claim 1, further comprising:
a plurality of first metal layers extending over at least one of the first to fourth gate electrodes,
wherein the plurality of first metal layers extend along a straight line extending in the first direction and are spaced apart from one another in the second direction, and
wherein the plurality of first metal layers comprise a metal layer of a bit line, a metal layer of a bit line bar, and a metal layer of a power line.

10. The SRAM device of claim 9, further comprising:
a plurality of second metal layers extending over the plurality of first metal layers in the second direction and being spaced apart from one another in the first direction;
a first bar-type metal layer connected to the first gate electrode;
a second bar-type metal layer connected to the third gate electrode; and
a third bar-type metal layer connected to a ground voltage supply contact,
wherein the first to third bar-type metal layers are disposed at a vertical level at which the plurality of first metal layers are disposed,
wherein in a one-bit memory cell of the SRAM device, a length, in the first direction, of each of the first to third bar-type metal layers is shorter than a length of each of the plurality of first metal layers, and
wherein the plurality of second metal layers comprise a metal layer of a word line and a metal layer of a ground line, each of the plurality of second metal layers being connected to a corresponding bar-type metal layer among the first to third bar-type metal layers through a corresponding via.

11. The SRAM device of claim 1,
wherein, when viewed in a plan view, the first pass transistor, the second pass transistor, the first pull-up transistor, the first pull-down transistor, the second pull-up transistor, and the second pull-down transistor are disposed in a first area of a one-bit memory cell of the SRAM device, and
wherein a ratio of a width, in the first direction, of the first area in which the one-bit memory cell of the SRAM device is disposed, to a width, in the second direction, of the first area is not greater than 1.6.

12. A static random-access memory (SRAM) device comprising:
a semiconductor substrate;
a first fin active region extending on the semiconductor substrate in a first direction;
a second fin active region extending on the semiconductor substrate in the first direction and being spaced apart from the first fin active region in a second direction perpendicular to the first direction; and
four gate electrodes extending in the second direction,
wherein two gate electrodes among the four gate electrodes intersecting the first fin active region and other two gate electrodes intersecting the second fin active region,
wherein each of the first fin active region and the second fin active region comprises:

a first region in which only a lower layer is arranged, and
a second region in which an upper layer is arranged on the lower layer,
wherein the two gate electrodes include a first gate electrode intersecting a second region of the first fin active region and are connected to a second region of the second fin active region through a first node,
wherein the other two gate electrodes include a second gate electrode intersecting the second region of the second fin active region and are connected to the second region of the first fin active region through a second node,
wherein the second node includes a first portion connected to the second gate electrode and a second portion connected to the second region of the first fin active region, and
wherein the second portion of the second node is buried in the lower layer of the first fin active region and contacts a side surface of the upper layer of the first fin active region.

13. The SRAM of claim 12,
wherein the two gate electrodes further include a third gate electrode intersecting a first region of the first fin active region,
wherein a lower layer of the first region of the first fin active region includes a plurality of nano-sheets intersecting the third gate electrode,
wherein the other two gate electrodes further include a fourth gate electrode intersecting a first region of the second fin active region,
wherein a lower layer of the first region of the second fin active region includes a plurality of nano-sheets intersecting the fourth gate electrode,
wherein a lower layer of the second region of the first fin active region includes a plurality of nano-sheets intersecting the first gate electrode,
wherein an upper layer of the second region of the first fin active region includes a plurality of nano-sheets intersecting the first gate electrode,
wherein the lower layer of the second region of the second fin active region includes a plurality of nano-sheets intersecting the second gate electrode, and
wherein the upper layer of the second region of the second fin active region includes a plurality of nano-sheets intersecting the second gate electrode.

14. The SRAM of claim 13,
wherein the first gate electrode and the lower layer of the second region of the first fin active region constitute a first pull-down transistor,
wherein the first gate electrode and the upper layer of the second region of the first fin active region constitute a first pull-up transistor,
wherein the second gate electrode and the lower layer of the second region of the second fin active region constitute a second pull-down transistor,
wherein the second gate electrode and the upper layer of the second region of the second fin active region constitute a second pull-up transistor,
wherein the third gate electrode and the lower layer of a first region of the first fin active region constitute a first pass transistor, and
wherein the fourth gate electrode and the lower layer of a first region of the second fin active region constitute a second pass transistor.

15. The SRAM of claim 12, further comprising:
a first contact connecting a first portion of a lower layer of the first fin active region to a bit line;

a second contact connecting a first portion of a lower layer of the second fin active region to a bit line bar;
a third contact connecting a second portion of the lower layer of the first fin active region to a ground voltage;
a fourth contact connecting an upper layer of the first fin active region to a power voltage;
a fifth contact connecting a second portion of the lower layer of the second fin active region to the ground voltage; and
a sixth contact connecting an upper layer of the second fin active region to the power voltage,
wherein the fifth contact, the sixth contact, and the first contact are aligned along a first straight line extending in the second direction, and
wherein the second contact, the fourth contact, and the third contact are aligned along a second straight line extending in the second direction.

16. The SRAM of claim 12, further comprising:
a plurality of first metal layers extending over at least one of the four gate electrodes, wherein the plurality of first metal layers extend along a straight line extending in the first direction and are apart from one another in the second direction; and
a plurality of second metal layers extending over the first metal layers in the second direction and being spaced apart from one another in the first direction,
wherein the plurality of first metal layers comprise a metal layer of a bit line, a metal layer of a bit line bar, and a metal layer of a power line, and
wherein the plurality of second metal layers comprise a metal layer of a word line and a metal layer of a ground line.

17. A static random-access memory (SRAM), comprising:
a plurality of horizontal fin active regions extending in a first direction and being spaced apart from one another in a second direction perpendicular to the first direction;
a plurality of vertical fin active regions extending in the second direction, being spaced apart from one another in the first direction, and intersecting two neighboring horizontal fin active regions among the plurality of horizontal fin active regions;
four gate electrodes extending in the second direction, being spaced apart from one another in a first region between the two neighboring vertical fin active regions, and intersecting the two neighboring horizontal fin active regions in the first region, wherein the four gate electrodes include a pair of inner gate electrodes and a pair of outer gate electrodes, wherein the pair of inner gate electrodes are disposed between the pair of outer gate electrodes, and wherein the pair of inner gate electrodes are shorter than the pair of outer gate electrodes;
a pair of nodes disposed in the first region and connecting the pair of outer gate electrodes to a horizontal fin active region, adjacent to the two neighboring horizontal fin active regions, of the plurality of horizontal fin active regions;
a plurality of first metal layers extending in the first direction and being spaced apart from one another in the second direction, wherein each of the plurality of horizontal fin active regions overlaps a corresponding first metal layer among the plurality of first metal layers; and
a plurality of second metal layers extending in the second direction and being spaced apart from one another in the second direction, wherein each of the plurality of second metal layers is arranged between corresponding two neighboring gate electrodes among the four gate electrodes.

18. The SRAM of claim 17,
wherein the plurality of vertical fin active regions includes:
a first row of vertical fin active regions that are arranged along a first straight line extending in the first direction, and
a second row of vertical fin active regions that are arranged along a second straight line extending in the first direction, and
wherein vertical fin active regions in the first and second columns are arranged in zigzags in the first direction.

19. The SRAM of claim 17,
wherein, in each of the plurality of horizontal fin active regions, a first portion in which only a lower layer is arranged and a second portion in which an upper layer is arranged on the lower layer are alternately repeated in the first direction,
wherein, in each of the plurality of vertical fin active regions, a third portion in which only a lower layer is arranged and a fourth portion in which an upper layer is arranged on the lower layer are arranged,
wherein the pair of inner gate electrodes of the first region intersect first portions of the two neighboring horizontal fin active regions,
wherein the pair of outer gate electrodes of the first region intersect second portions of the two neighboring horizontal fin active regions, and
wherein the pair of nodes include a first node of an 'L' shape and a second node of a shape obtained by rotating 'L' 180 degrees, and connect both ends of the pair of outer gate electrodes, respectively.

20. The SRAM of claim 17,
wherein the plurality of first metal layers comprises:
a metal layer of a bit line and a metal layer of a bit line bar, each of the metal layer of the bit line and the metal layer of the bit line bar overlapping a corresponding horizontal fin active region among the plurality of horizontal fin active regions;
a metal layer of a power line arranged between the metal layer of the bit line and the metal layer of the bit line bar and overlapping ends, disposed between the metal layer of the bit line and the metal layer of the bit line bar, of the plurality of vertical fin active regions; and
a plurality of bar-type metal layers arranged along a straight line extending in the first direction, each of the plurality of bar-type metal layers being connected to a corresponding one of a pair of vertical fin active regions among the plurality of vertical fin active regions and the pair of inner gate electrodes between the pair of vertical fin active regions.

* * * * *